United States Patent
Yoo

(10) Patent No.: US 12,366,895 B2
(45) Date of Patent: Jul. 22, 2025

(54) HINGE ASSEMBLY AND ELECTRONIC DEVICE INCLUDING THE SAME

(71) Applicant: SAMSUNG ELECTRONICS CO., LTD., Suwon-si (KR)

(72) Inventor: Chungkeun Yoo, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 284 days.

(21) Appl. No.: 18/078,415

(22) Filed: Dec. 9, 2022

(65) Prior Publication Data

US 2023/0107816 A1 Apr. 6, 2023

Related U.S. Application Data

(63) Continuation of application No. PCT/KR2022/011037, filed on Jul. 27, 2022.

(30) Foreign Application Priority Data

Sep. 27, 2021 (KR) .......................... 10-2021-0127001

(51) Int. Cl.
G06F 1/16 (2006.01)
H04M 1/02 (2006.01)

(52) U.S. Cl.
CPC .......... *G06F 1/1681* (2013.01); *G06F 1/1652* (2013.01); *H04M 1/022* (2013.01); *H04M 1/0268* (2013.01); *G06F 1/1616* (2013.01)

(58) Field of Classification Search
CPC ... H04M 1/022; H04M 1/0268; G06F 1/1681; G06F 1/1652; G06F 1/1616
See application file for complete search history.

(56) References Cited

U.S. PATENT DOCUMENTS 9,848,502 B1 * 12/2017 Chu ...................... G06F 1/1681
10,761,572 B1 * 9/2020 Siddiqui ............... G06F 1/1616
(Continued)

FOREIGN PATENT DOCUMENTS

JP 6065984 B2 1/2017
KR 101058715 B1 8/2006
(Continued)

OTHER PUBLICATIONS

International Search Report with English Translation and Written Opinion for International Application No. PCT/KR2022/011037; International Filing Date Oct. 27, 2022; Date of Mailing Nov. 9, 2022; 9 pages.
(Continued)

*Primary Examiner* — Nidhi Thaker
(74) *Attorney, Agent, or Firm* — CANTOR COLBURN LLP

(57) ABSTRACT

An electronic device including a first housing supporting a first display area, a second housing supporting a second display area, and a hinge assembly connecting the first housing to the second housing. The hinge assembly including a hinge bracket having a fixed cam that defines a pair of hinge axes, a pair of rotators connected to the hinge bracket and respectively rotatable on the pair of hinge axes, a pair of arms pivotably connected to the pair of rotators based on pivot axes, respectively, and each including a main body including a rotation cam interoperating with the fixed cam on an end of the main body and a bent body bent and extending from the main body, and at least a pair of elastic members configured to provide an elastic force to the bent body to press the rotation cam with respect to the fixed cam.

20 Claims, 20 Drawing Sheets

(56) References Cited

U.S. PATENT DOCUMENTS

| | | | | |
|---|---|---|---|---|
| 10,824,197 | B1* | 11/2020 | Hsu | G06F 1/1641 |
| 11,553,613 | B2* | 1/2023 | Sim | G06F 1/1681 |
| 11,726,530 | B2* | 8/2023 | Kang | H04M 1/0268 |
| | | | | 361/679.27 |
| 11,832,405 | B2* | 11/2023 | Zhang | F16C 11/04 |
| 11,983,047 | B2* | 5/2024 | Park | G06F 1/1679 |
| 12,058,276 | B2* | 8/2024 | Jiang | H04M 1/022 |
| 2012/0307472 | A1* | 12/2012 | Bohn | G06F 1/1652 |
| | | | | 361/807 |
| 2018/0356858 | A1* | 12/2018 | Siddiqui | G06F 1/1637 |
| 2019/0179373 | A1 | 6/2019 | Cheng et al. | |
| 2020/0233466 | A1 | 7/2020 | Sanchez et al. | |
| 2020/0348732 | A1* | 11/2020 | Kang | H04M 1/022 |
| 2023/0143520 | A1* | 5/2023 | Park | G06F 1/16 |
| | | | | 455/566 |

FOREIGN PATENT DOCUMENTS

| | | |
|---|---|---|
| KR | 20060096299 A | 9/2006 |
| KR | 20090100286 A | 9/2009 |
| KR | 20100137292 A | 12/2010 |
| KR | 20110005117 A | 1/2011 |
| KR | 20110126975 A | 11/2011 |
| KR | 20190067401 A | 6/2019 |
| KR | 20200117773 A | 10/2020 |
| KR | 20200126524 A | 11/2020 |
| KR | 20200135636 A | 12/2020 |
| KR | 20210066784 A | 6/2021 |

OTHER PUBLICATIONS

Extended European Search Report Issued In EP Application No. 22873087.5-1218, Mail Date Sep. 3, 2024, 11 Pages.

* cited by examiner

HINGE ASSEMBLY AND ELECTRONIC DEVICE INCLUDING THE SAME

CROSS-REFERENCE TO RELATED APPLICATIONS

This application is a national stage of International Application No. PCT/KR2022/011037 designating the United States, filed on Jul. 27, 2022, in the Korean Intellectual Property Receiving Office and claiming priority to Korean Patent Application No. 10-2021-0127001, filed on Sep. 27, 2021, in the Korean Intellectual Property Office, the disclosures of which are incorporated by reference herein in their entireties.

BACKGROUND

1. Field

The disclosure relates to a hinge assembly and an electronic device including the hinge assembly.

2. Description of Related Art

With the development of display-related technologies, electronic devices with flexible displays have been developed. A flexible display may be used in the form of a flat surface, and may also be deformed to be used in a specific shape. For example, an electronic device with a flexible display may be implemented in a foldable form to be folded or unfolded about at least one folding axis.

SUMMARY

To implement a folding operation or unfolding operation of an electronic device, a hinge assembly is provided between a first housing and a second housing. The hinge assembly includes a structure for generating a force to maintain a predetermined folding state of the electronic device. For example, the hinge assembly may generate a force by using a cam and an elastic member. In one embodiment, when the cam and the elastic member are arranged in the same direction, the length of the overall structure of the hinge assembly may increase and a driving sound may occur due to a gap between the cam and a shaft.

Example embodiments provide a hinge assembly with a relatively short length and an electronic device including the hinge assembly by arranging an elastic member perpendicular to a hinge axis.

Example embodiments provide a hinge assembly that may reduce a driving sound during operation and an electronic device including the hinge assembly.

According to various example embodiments, an electronic device includes a display including a first area, a second area, and a folding area between the first area and the second area, a first housing configured to support the first area, a second housing configured to support the second area, and a hinge assembly configured to connect the first housing to the second housing. The hinge assembly includes a hinge bracket including a fixed cam on an end of the hinge bracket and configured to define a pair of hinge axes, a pair of rotators connected to the hinge bracket and respectively rotatable on the pair of hinge axes, at least a pair of arms pivotably connected to the pair of rotators based on pivot axes, respectively, and each including a main body including a rotation cam interoperating with the fixed cam on an end of the main body and a bent body bent and extending from the main body, and at least a pair of elastic members disposed to be perpendicular to the pair of hinge axes and configured to provide an elastic force to the bent body to press the rotation cam with respect to the fixed cam.

According to various example embodiments, a hinge assembly applied to a foldable electronic device includes a hinge bracket including a fixed cam on an end of the hinge bracket and configured to define a pair of hinge axes, a pair of rotators connected to the hinge bracket and respectively rotatable on the pair of hinge axes, at least a pair of arms pivotably connected to the pair of rotators based on pivot axes, respectively, and each including a main body including a rotation cam interoperating with the fixed cam on an end of the main body and a bent body bent and extending from the main body, and at least a pair of elastic members disposed to be perpendicular to the pair of hinge axes and configured to provide an elastic force to the bent body to press the rotation cam with respect to the fixed cam.

According to various example embodiments, an electronic device includes a display including a first area, a second area, and a folding area between the first area and the second area, a first housing configured to support the first area, a second housing configured to support the second area, and a hinge assembly configured to connect the first housing to the second housing and operate between a folded state in which the first area and the second area face each other and an unfolded state in which the first area and the second area do not face each other, wherein the hinge assembly includes a hinge bracket including a fixed cam on an end of the hinge bracket and configured to define a pair of hinge axes, a pair of rotators connected to the hinge bracket and respectively rotatable on the pair of hinge axes, at least a pair of arms pivotably connected to the pair of rotators based on pivot axes, respectively, and each including a main body including a rotation cam interoperating with the fixed cam on an end of the main body and a bent body bent and extending from the main body, and at least a pair of elastic members disposed to be perpendicular to the pair of hinge axes and configured to provide an elastic force to the bent body to press the rotation cam with respect to the fixed cam, wherein the rotator may include a protruding pin protruding from a rear surface of the rotator and configured to define the pivot axis, the arm may further include a pin hole into which the protruding pin is inserted, the arm may further include a protrusion formed on an end of the main body, the rotator may further include a protrusion insertion groove into which the protrusion is inserted, and in an intermediate state between the unfolded state and the folded state, the arm pivots on the pivot axis.

According to various example embodiments, the hinge assembly may be formed in a relatively short length by arranging the elastic member perpendicular to the hinge axis and the total volume and/or weight of the hinge assembly may decrease.

According to various example embodiments, the hinge assembly may decrease a driving sound that occurs during operation.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
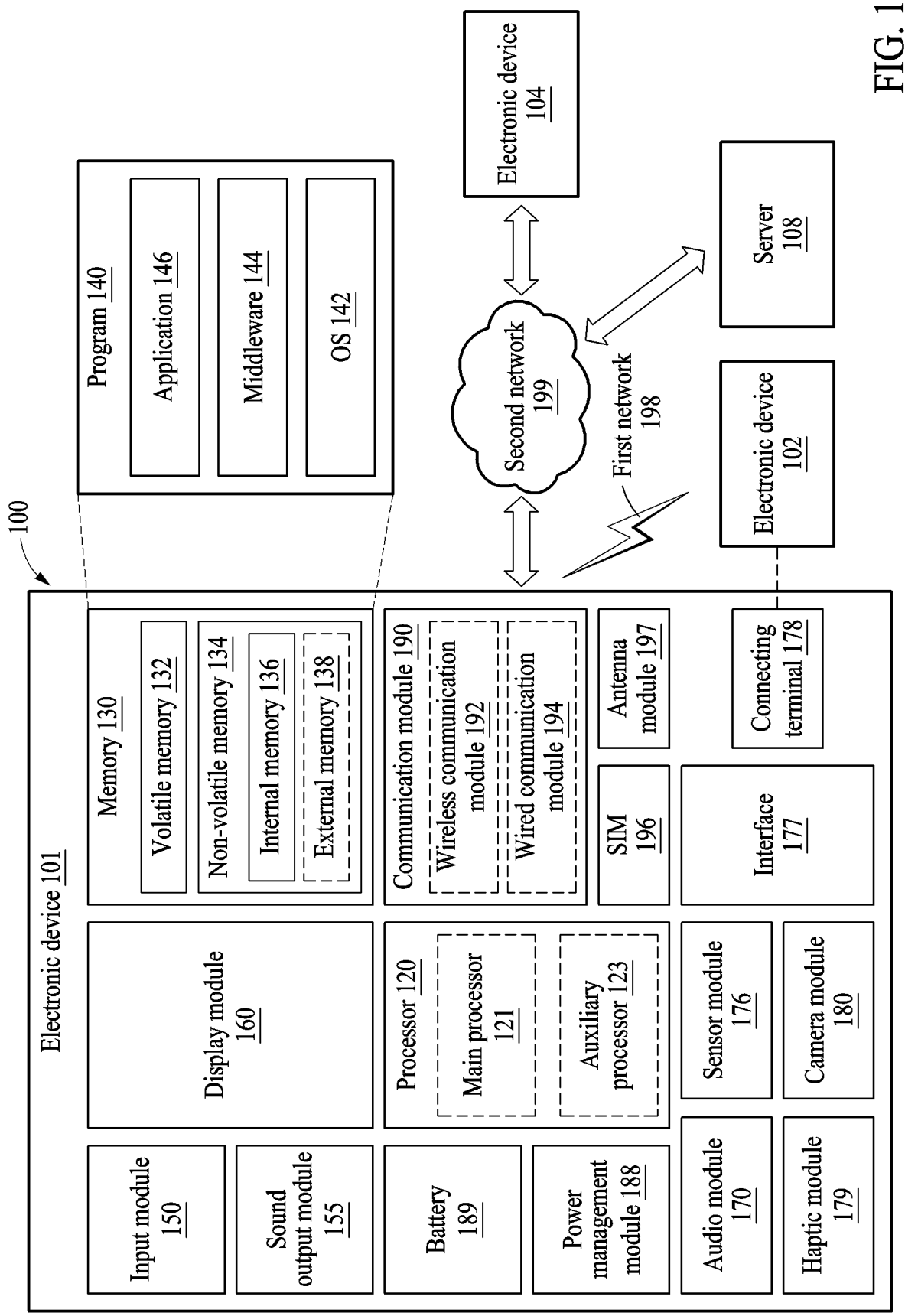
FIG. 1 is a block diagram illustrating an electronic device in a network environment according to various example embodiments.

Hereinafter, various example embodiments will be described in greater detail with reference to the accompanying drawings. When describing the example embodiments with reference to the accompanying drawings, like reference numerals refer to like elements and a repeated description related thereto will be omitted.

FIG. 1 is a block diagram illustrating an electronic device 101 in a network environment 100 according to various example embodiments.

Referring to FIG. 1, the electronic device 101 in the network environment 100 may communicate with an electronic device 102 via a first network 198 (e.g., a short-range wireless communication network), or communicate with an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen). The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor. The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC. The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
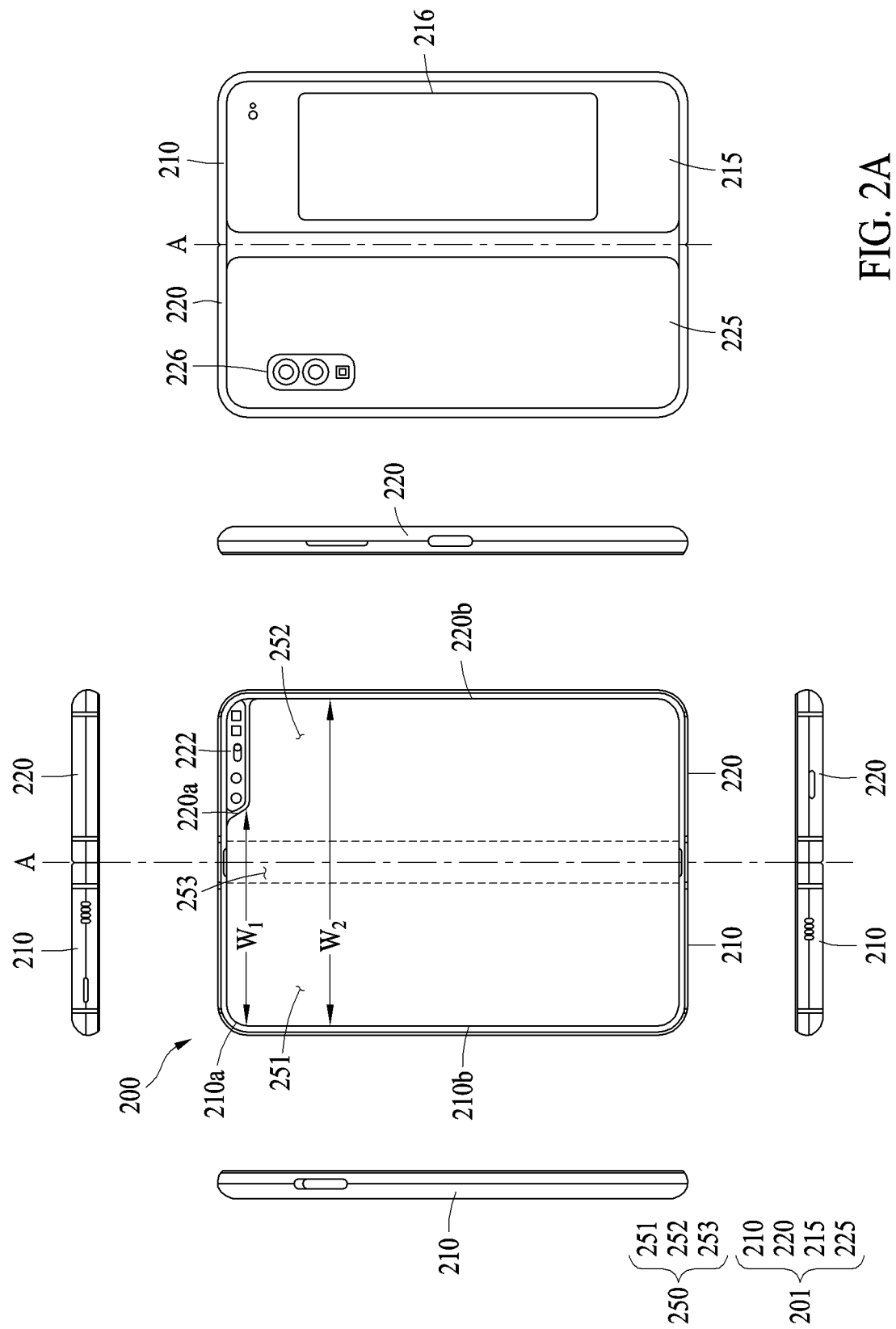
FIG. 2A is a view of an unfolded state of an electronic device according to various example embodiments.
Figure 2B:
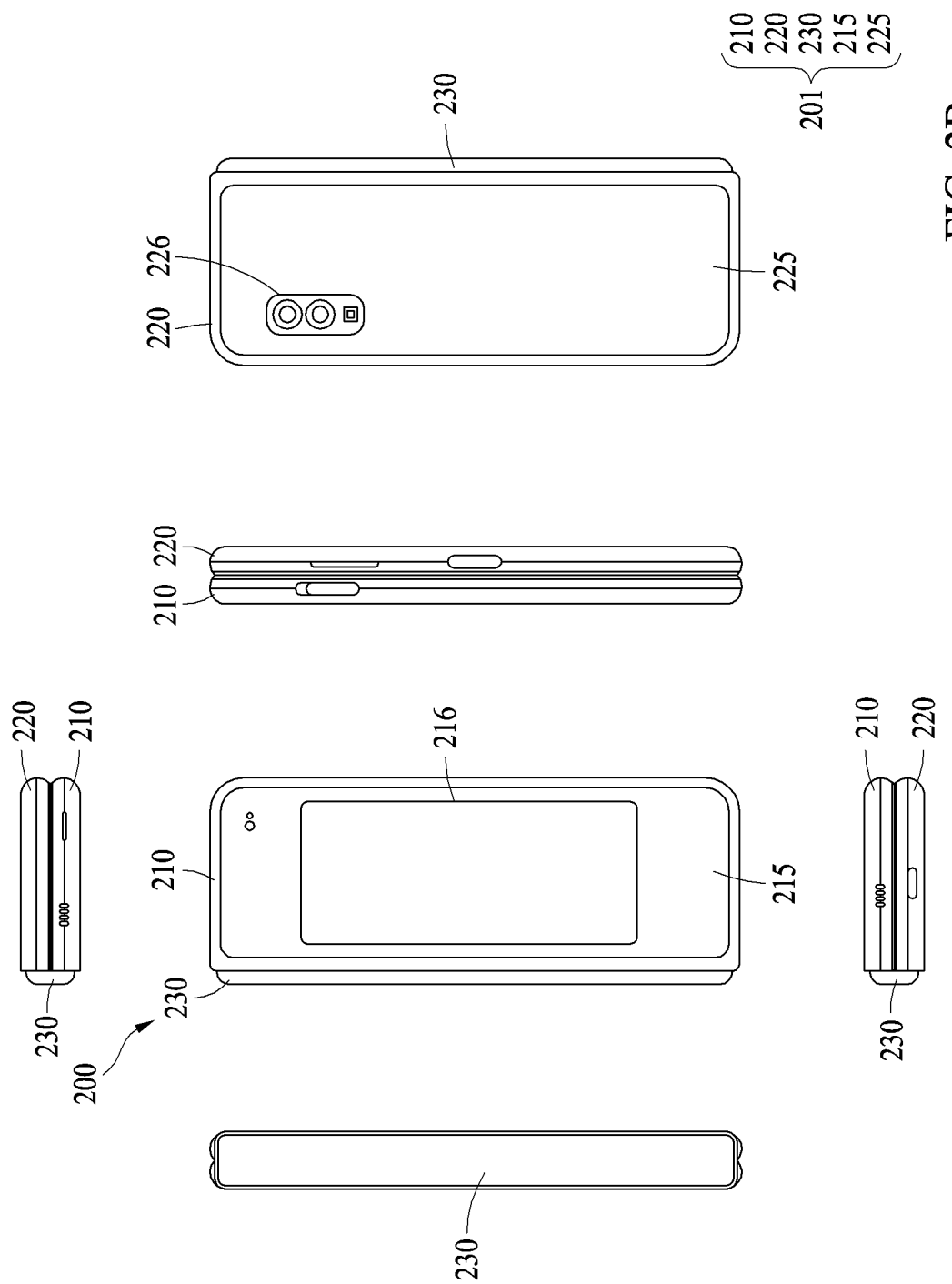
FIG. 2B is a view of a folded state of the electronic device according to various example embodiments.
Figure 2C:
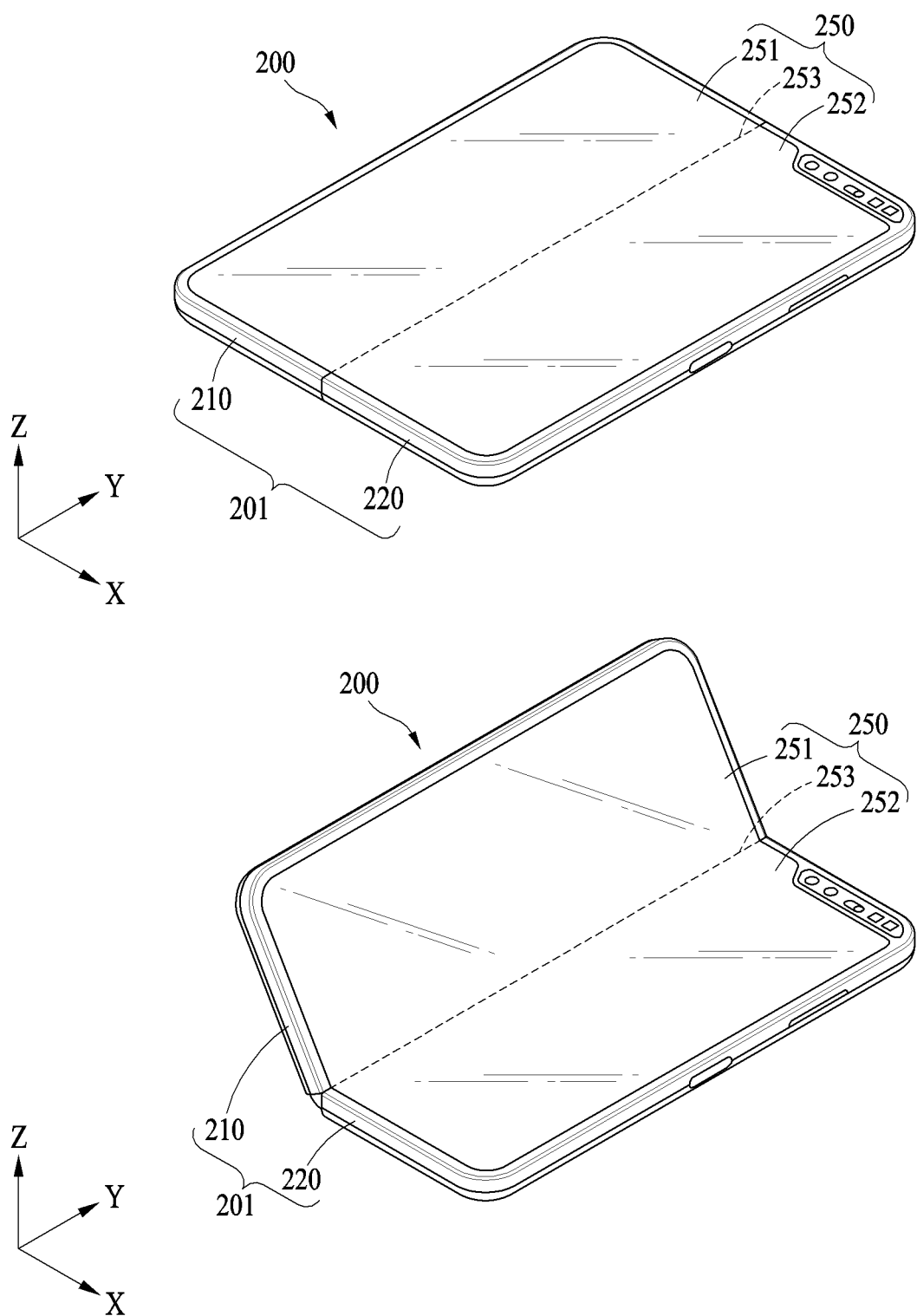
FIG. 2C is a perspective view of the electronic device in a fully unfolded state or a partially unfolded state (or an intermediate state) according to various example embodiments.

FIG. 2A is a diagram illustrating an unfolded state of an electronic device 200 according to various example embodiments. FIG. 2B is a diagram illustrating a folded state of the electronic device 200 according to various example embodiments. FIG. 2C is a perspective view illustrating an example of a fully unfolded state or an intermediate state of the electronic device 200 according to various example embodiments.

The electronic device 200 of FIGS. 2A through 2C is an example of the electronic device 101 of FIG. 1 and may be a foldable or bendable electronic device.

In FIG. 2C and other following drawings, illustrated is a spatial coordinate system defined by an X-axis, a Y-axis, and a Z-axis that are orthogonal to each other. Here, the X-axis may represent a width direction of an electronic device, the Y-axis may represent a length direction of the electronic device, and the Z-axis may represent a height (or thickness) direction of the electronic device. In the following description, a "first direction" may refer to a direction parallel to the Z-axis.

Referring to FIGS. 2A and 2B, in an example embodiment, the electronic device 200 may include a foldable housing 201 and a flexible or foldable display 250 (hereinafter, the "display" 250 in short) (e.g., the display module 160 of FIG. 1) disposed in a space formed by the foldable housing 201. A surface on which the display 250 is disposed (or a surface on which the display 250 is viewed from the outside of the electronic device 200) may be defined as a front surface of the electronic device 200. In addition, a surface opposite to the front surface may be defined as a rear surface of the electronic device 200. Further, a surface surrounding a space between the front surface and the rear surface may be defined as a side surface of the electronic device 200.

According to various example embodiments, the foldable housing 201 may include a first housing structure 210, a second housing structure 220 including a sensor area 222, a first rear cover 215, a second rear surface 225, and a hinge structure 230. Here, the hinge structure 230 may include a hinge cover that covers a foldable portion of the foldable housing 201. The foldable housing 201 of the electronic device 200 is not limited to the shape and combination shown in FIGS. 2A and 2B, and may be implemented in a different shape or a different combination of components. For example, in an example embodiment, the first housing structure 210 and the first rear cover 215 may be integrally formed, and the second housing structure 220 and the second rear cover 225 may be integrally formed.

According to various example embodiments, the first housing structure 210 may be connected to the hinge structure 230 and may include a first surface facing a first direction and a second surface facing a second direction opposite to the first direction. The second housing structure 220 may be connected to the hinge structure 230 and may include a third surface facing a third direction and a fourth surface facing a fourth direction opposite to the third direction. The second housing structure 220 may rotate with respect to the first housing structure 210 about the hinge structure 230. A state of the electronic device 200 may be changed to a folded state or an unfolded state.

According to an example embodiment, the first surface may face the third surface in a state in which the electronic device 200 is fully folded and the third direction may be identical to the first direction in a state in which the electronic device 200 is fully unfolded.

According to various example embodiments, the first housing structure 210 and the second housing structure 220 are disposed on both sides with respect to a folding axis A and generally may be symmetrical with respect to the folding axis A. As to be described hereinafter, an angle or distance between the first housing structure 210 and the second housing structure 220 may vary depending on whether the state of the electronic device 200 is the unfolded state, the folded state, or a partially unfolded or folded state (or an intermediate state). According to an example embodiment, unlike the first housing structure 210, the second housing structure 220 may additionally include the sensor area 222, in which various sensors are arranged, however, the first housing structure 210 and the second housing structure 220 may have shapes symmetrical to each other in areas other than the sensor area 222.

According to various example embodiments, as shown in FIG. 2A, the first housing structure 210 and the second housing structure 220 may together form a recess for accommodating the display 250. In an example embodiment, due to the sensor area 222, the recess may have at least two different widths in a direction perpendicular to the folding axis A. For example, the recess may have a first width w1 between a first portion 210a of the first housing structure 210 parallel to the folding axis A and a first portion 220a of the second housing structure 220 formed on a periphery of the sensor area 222, and a second width w2 formed by a second portion 210b of the first housing structure 210 and a second portion 220b of the second housing structure 220 not corresponding to the sensor area 222 and being parallel to the folding axis A. In this case, the second width w2 may be greater than the first width w1. In an example embodiment, the first portion 220a and the second portion 220b of the second housing structure 220 may be at different distances from the folding axis A. The widths of the recess are not limited to the shown example. In an example embodiment, the recess may have a plurality of widths according to the shape of the sensor area 222 or asymmetrical portions of the first housing structure 210 and the second housing structure 220. According to various example embodiments, the sensor area 222 may be formed to have a predetermined area adjacent to one corner of the second housing structure 220. However, the arrangement, shape, and size of the sensor area 222 are not limited to the shown example. For example, in an example embodiment, the sensor area 222 may be provided at another corner of the second housing structure 220 or in a predetermined area between an upper corner and a lower corner. In an example embodiment, components embedded in the electronic device 200 to perform various functions may be exposed to the front surface of the electronic device 200 through the sensor area 222 or through one or more openings provided in the sensor area 222. In various example embodiments, the components may include various types of sensors. The sensors may include, for example, at least one of a front camera, a receiver, or a proximity sensor. According to various example embodiments, the sensor area 222 may not be included in the second housing structure 220 or may be formed at a position different from that shown in the drawings.

According to various example embodiments, at least a portion of the first housing structure 210 and the second housing structure 220 may be formed of a metal material or a non-metal material having a selected magnitude of rigidity to support the display 250. At least a portion formed of the metal material may provide a ground plane for the electronic device 200, and may be electrically connected to a ground line formed on a printed circuit board (PCB) disposed inside the foldable housing 201.

According to various example embodiments, the first rear cover 215 may be disposed on one side of the folding axis A on a rear surface of the electronic device 200, and may have, for example, a substantially rectangular periphery that may be surrounded by the first housing structure 210. Similarly, the second rear cover 225 may be disposed on the other side of the folding axis A on the rear surface of the electronic device 200, and may have a periphery that may be surrounded by the second housing structure 220.

According to various example embodiments, the first rear cover 215 and the second rear cover 225 may be substantially symmetrical with respect to the folding axis A. However, the first rear cover 215 and the second rear cover 225 are not necessarily mutually symmetrical. In another example, the electronic device 200 may include a first rear cover 215 and a second rear cover 225 in various shapes. In an example embodiment, the first rear cover 215 may be formed integrally with the first housing structure 210, and the second rear cover 225 may be formed integrally with the second housing structure 220.

According to various example embodiments, the first rear cover 215, the second rear cover 225, the first housing structure 210, and the second housing structure 220 may form a space in which various components (e.g., a PCB, or a battery) of the electronic device 200 are to be disposed. In an example embodiment, one or more components may be disposed or visually exposed on the rear surface of the electronic device 200. For example, at least a portion of a sub-display may be visually exposed through a first rear area 216 of the first rear cover 215. In another example embodiment, one or more components or sensors may be visually exposed through a second rear area 226 of the second rear cover 225. In various example embodiments, the sensors may include a proximity sensor and/or a rear camera.

According to various example embodiments, a front camera exposed to the front surface of the electronic device 200 through one or more openings provided in the sensor area 222, or a rear camera exposed through the second rear area 226 of the second rear cover 225 may include one or more lenses, an image sensor, and/or an image signal processor. A flash may include, for example, a light-emitting diode (LED) or a xenon lamp. In some example embodiments, two or more lenses (e.g., infrared camera, wide-angle, and telephoto lenses) and image sensors may be disposed on one surface of the electronic device 200.

Referring to FIG. 2B, the hinge cover may be disposed between the first housing structure 210 and the second housing structure 220 to cover internal components (e.g., the hinge structure 230). According to an example embodiment, the hinge structure 230 may be covered by a portion of the first housing structure 210 and a portion of the second housing structure 220, or may be exposed to the outside, depending on the state (e.g., the unfolded state, the intermediate state, or the folded state) of the electronic device 200.

For example, when the electronic device 200 is in the unfolded state (e.g., the fully unfolded state) as illustrated in FIG. 2A, the hinge structure 230 may be covered by the first housing structure 210 and the second housing structure 220 not to be exposed. In another example, when the electronic device 200 is in the folded state (e.g., a fully folded state), as shown in FIG. 2B, the hinge structure 230 may be exposed to the outside between the first housing structure 210 and the second housing structure 220. In another example, when the first housing structure 210 and the second housing structure 220 are in the intermediate state where the first housing structure 210 and the second housing structure 220 are folded with a certain angle, a portion of the hinge structure 230 may be exposed to the outside between the first housing structure 210 and the second housing structure 220. However, the area exposed in this example may be smaller than that in the fully folded state. In an example embodiment, the hinge structure 230 may include a curved surface.

According to various example embodiments, the display 250 may be disposed in a space formed by the foldable housing 201. For example, the display 250 may be seated in the recess formed by the foldable housing 201 and may be viewed from the outside through the front surface of the electronic device 200. For example, the display 250 may constitute most of the front surface of the electronic device 200. Accordingly, the front surface of the electronic device 200 may include the display 250, and a partial area of the first housing structure 210 and a partial area of the second housing structure 220, which are adjacent to the display 250. In addition, the rear surface of the electronic device 200 may include the first rear cover 215, a partial area of the first housing structure 210 adjacent to the first rear cover 215, the second rear cover 225, and a partial area of the second housing structure 220 adjacent to the second rear cover 225.

According to various example embodiments, the display 250 may refer to a display in which at least one area is deformable into a planar surface or a curved surface. In an example embodiment, the display 250 may include a folding area 253, a first area 251 disposed on one side of the folding area 253 (e.g., on the left side of the folding area 253 shown in FIG. 2A), and a second area 252 disposed on the other side of the folding area 253 (e.g., on the right side of the folding area 253 shown in FIG. 2A).

However, the area division of the display 250 shown in FIG. 2A is merely an example, and the display 250 may be divided into a plurality of areas (e.g., four or more areas, or two areas) depending on the structure or functions thereof. In an example, as shown in FIG. 2A, the display 250 may be divided into areas based on the folding area 203 extending in parallel to the folding axis A. In another example, the display 250 may be divided into areas based on another folding axis (e.g., a folding axis parallel to a width direction of an electronic device).

According to various example embodiments, the display 250 may be coupled to or disposed adjacent to a touch panel in which a touch sensing circuit and a pressure sensor configured to measure an intensity (or pressure) of a touch are provided. For example, the display 250 is an example of a touch panel, and may be coupled to or disposed adjacent to a touch panel for detecting an electromagnetic resonance (EMR) type stylus pen.

According to various example embodiments, the first area 251 and the second area 252 may generally have symmetrical shapes with respect to the folding area 253. However, unlike the first area 251, the second area 252 may include a notch cut according to inclusion of the sensor area 222, but the other areas of the second area 252 may be symmetrical to the first area 251. For example, the first area 251 and the second area 252 may include mutually symmetrical portions and mutually asymmetrical portions.

According to various example embodiments, an edge thickness of each of the first area 251 and the second area 252 may be different from an edge thickness of the folding area 253. The edge thickness of the folding area 253 may be less than those of the first area 251 and the second area 252. For example, the first area 251 and the second area 252 may be asymmetrical in terms of thickness when cross-sectionally viewed. For example, an edge of the first area 251 may be formed to have a first radius of curvature and an edge of the second area 252 may be formed to have a second radius of curvature that is different from the first radius of curvature. In another example, the first area 251 and the second area 252 may be symmetrical in terms of thickness when cross-sectionally viewed.

Hereinafter, each area of the display 250 and operations of the first housing structure 210 and the second housing structure 220 depending on the state (e.g., a folded state, an unfolded state, or an intermediate state) of the electronic device 200) will be described.

According to various example embodiments, when the electronic device 200 is in the unfolded state (e.g., FIG. 2A), the first housing structure 210 and the second housing structure 220 may be arranged to face the same direction with an angle of 180 degrees. The surface of the first area 251 of the display 250 and the surface of the second area 252 thereof may face the same direction (e.g., a front direction of an electronic device) with an angle of 180 degrees. The folding area 253 may form the same plane together with the first area 251 and the second area 252.

According to various example embodiments, when the electronic device 200 is in the folded state (e.g., FIG. 2B), the first housing structure 210 and the second housing structure 220 may be arranged to face each other. The surface of the first area 251 and the surface of the second area 252 of the display 250 may face each other and may form a narrow angle (e.g., an angle between 0 degrees to 10 degrees). At least a portion of the folding area 253 may form a curved surface having a predetermined curvature.

According to various example embodiments, when the electronic device 200 is in the intermediate state, the first housing structure 210 and the second housing structure 220 may be arranged to form a certain angle therebetween. The surface of the first area 251 and the surface of the second area 252 of the display 250 may form an angle greater than that in the folded state and smaller than that in the unfolded state. At least a portion of the folding area 253 may include a curved surface having a predetermined curvature, and the curvature may be less than that in the folded state.

The upper part of FIG. 2C illustrates a fully unfolded state of the electronic device 200 and the lower part of FIG. 2C illustrates a partially folded state, that is, an intermediate state of the electronic device 200. As described above, the state of the electronic device 200 may be changed to the folded state or the unfolded state. According to an example embodiment, when viewed in a direction of a folding axis (e.g., the folding axis A of FIG. 2A), the electronic device 200 may be folded in two types, i.e., an "in-folding" type in which the front surface of the electronic device 200 is folded to form an acute angle, and an "out-folding" type in which the front surface of the electronic device 200 is folded to form an obtuse angle. In an example, in the state in which the electronic device 200 is folded in the in-folding type, the first surface of the first housing structure 210 may face the third surface of the second housing structure 220. In the fully unfolded state, the first surface of the first housing structure 210 and the third surface of the second housing structure 220 may face the same direction (e.g., a direction parallel to the z-axis).

In another example, when the electronic device 200 is folded in the out-folding type, the second surface of the first housing structure 210 may face the fourth surface of the second housing structure 220.

In addition, although not shown in the drawings, the electronic device 200 may include a plurality of hinge axes (e.g., two parallel hinge axes including the folding axis A of FIG. 2A and another axis parallel to the folding axis A). In this example, the electronic device 200 may also be folded in a "multi-folding" type in which the in-folding type is combined with the out-folding type.

The in-folding type may refer to a state in which the display 250 is not exposed to the outside in the fully folded state. The out-folding type may refer to a state in which the display 250 is exposed to the outside in the fully folded state. The lower part of FIG. 2C shows an intermediate state in which the electronic device 200 is partially unfolded in an in-folding process.

Although the state in which the electronic device 200 is folded in the in-folding type will be described below for convenience's sake, it should be noted that the description may be similarly applied to the state in which the electronic device 200 is folded in the out-folding type.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 3:
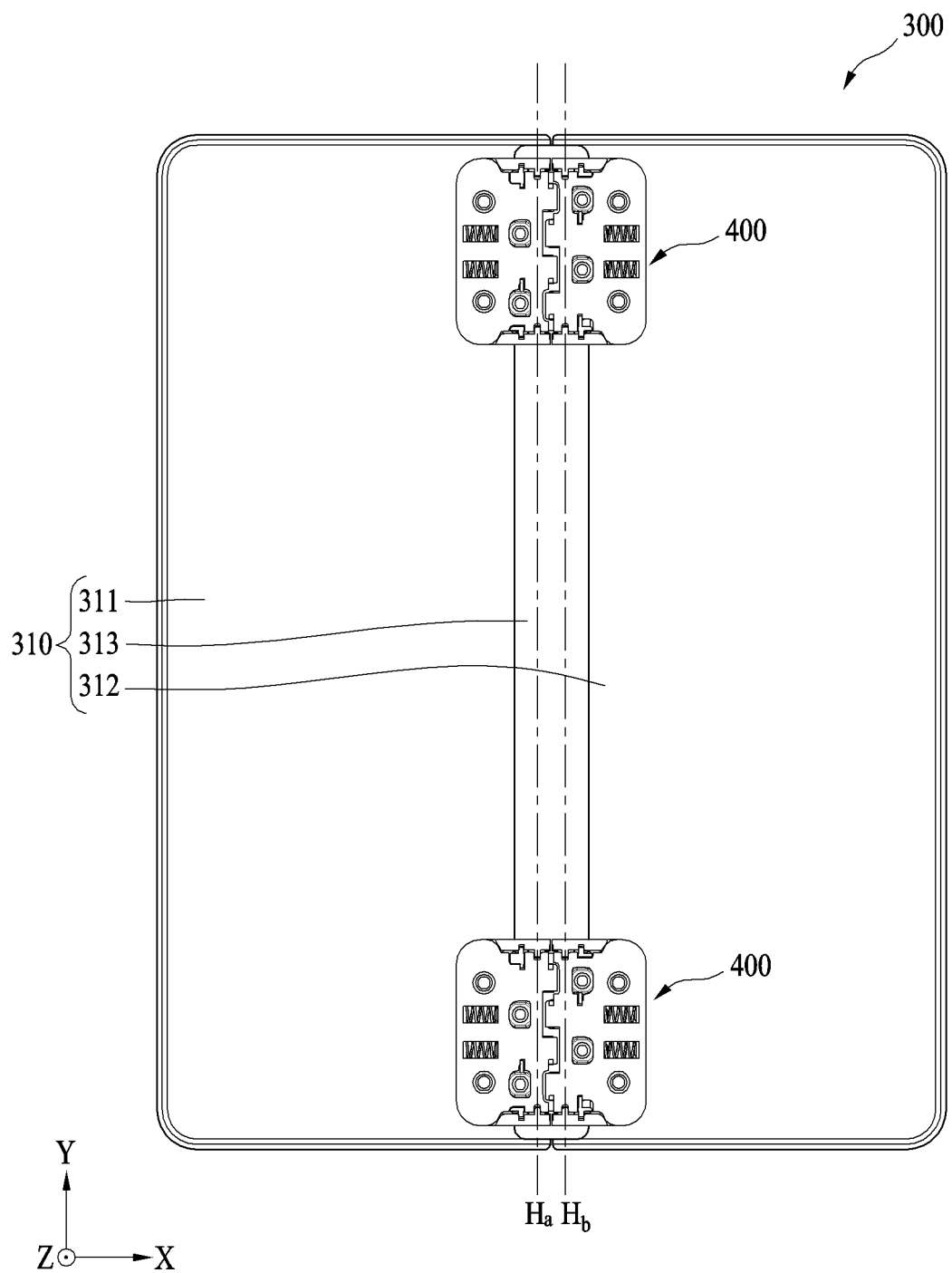
FIG. 3 is a front view illustrating a state in which a hinge assembly is applied to an electronic device according to an example embodiment.

FIG. 3 is a front view illustrating a state in which a hinge assembly is applied to an electronic device according to an example embodiment.

Referring to FIG. 3, an electronic device 300 (e.g., the electronic device 101 of FIG. 1 or the electronic device 200 of FIGS. 2A through 2C) according to an example embodiment may be a foldable electronic device. For example, the electronic device 300 may be folded or unfolded based on a pair of hinge axes Ha and Hb. The pair of hinge axes Ha and Hb may be substantially parallel with each other. However, FIG. 3 is merely an example, and the size, the shape, the structure, and the hinge axes of the electronic device 300 are not limited thereto. For example, the electronic device 300 of FIG. 3 may include the hinge axis Ha or Hb in the y-axis direction, which is a long side direction, however, an electronic device according to an example embodiment may also include a hinge axis in the x-axis direction, which is a short side direction.

The electronic device 300 according to an example embodiment may include a housing 310 (e.g., the foldable housing 201 of FIGS. 2A through 2C), a display (not shown) (e.g., the display module 160 of FIG. 1, or the display 250 of FIGS. 2A through 2C), and a hinge assembly 400.

In an example embodiment, the housing 310 may form at least a portion of external surfaces of the electronic device 300. The housing 310 may include a first housing 311 (e.g., the first housing structure 210 of FIGS. 2A through 2C), a second housing 312 (e.g., the second housing structure 220 of FIGS. 2A through 2C), and a hinge housing 313.

In an example embodiment, the first housing 311 and the second housing 312 may be foldably connected to each other by the hinge assembly 400. An angle or distance between the first housing 311 and the second housing 312 may vary depending on whether the electronic device 300 is in a flat state or unfolded state, a folded state, or an intermediate state. The intermediate state described above may include all states between the unfolded state and the folded state. The hinge housing 313 may be disposed between the first housing 311 and the second housing 312 to provide a space for mounting internal components (e.g., the hinge assembly 400). For example, the hinge housing 313 may be configured to cover the hinge assembly 400 such that the hinge assembly 400 is not exposed to the outside.

In an example embodiment, the first housing 311 and the second housing 312 may provide a space in which the display 250 is disposed. The display 250 may be a foldable flexible display. For example, the display 250 may include a first area (e.g., the first area 251 of FIG. 2C), a second area (e.g., the second area 252 of FIG. 2C), and a folding area (e.g., the folding area 253 of FIG. 2C) between the first area and the second area. The first housing 311 may be disposed at a position corresponding to the first area 251 of the display 250 to support the first area 251 of the display 250. The second housing 312 may be disposed at a position corresponding to the second area 252 of the display 250 to support the second area 252 of the display 250.

In an example embodiment, the hinge assembly 400 may be disposed between the first housing 311 and the second housing 312 to connect the first housing 311 to the second housing 312. For example, the hinge structure 230 of FIG. 2B may include a plurality of hinge assemblies 400. The plurality of hinge assemblies 400 may be spaced apart from each other along the hinge axis Ha or Hb. For example, as shown in FIG. 3, two hinge assemblies 400 may be spaced apart along the hinge axis Ha or Hb. However, this is merely an example, and the number of hinge assemblies 400 is not limited thereto. The hinge assembly 400 may implement folding or unfolding operations of the electronic device 300. The hinge assembly 400 may operate between a folded state in which the first area 251 and the second area 252 face each other and an unfolded state in which the first area 251 and the second area 252 do not face each other. The hinge assembly 400 may generate a force (e.g., a friction force) to maintain a specific folded state of the electronic device 300. For example, when the electronic device 300 is in the folded state, the hinge assembly 400 may generate a force for allowing the electronic device 300 to remain in the folded state. When the electronic device 300 is in the unfolded state, the hinge assembly 400 may generate a force for allowing the electronic device 300 to remain in the unfolded state. When the electronic device 300 is in the intermediate state, the hinge assembly 400 may generate a force for allowing the electronic device 300 to remain in the intermediate state.

Figure 4A:
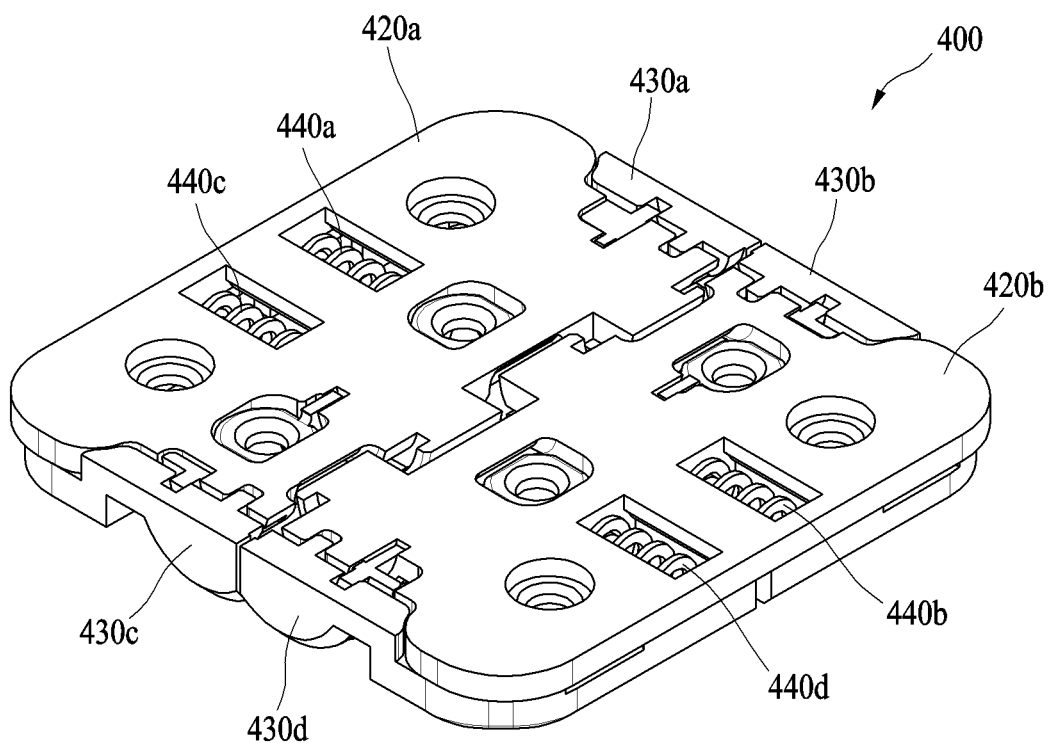
FIG. 4A is a perspective view illustrating an unfolded state of a hinge assembly according to an example embodiment.
Figure 4A:
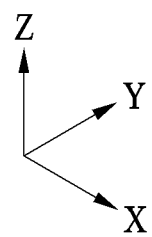
Figure 4B:
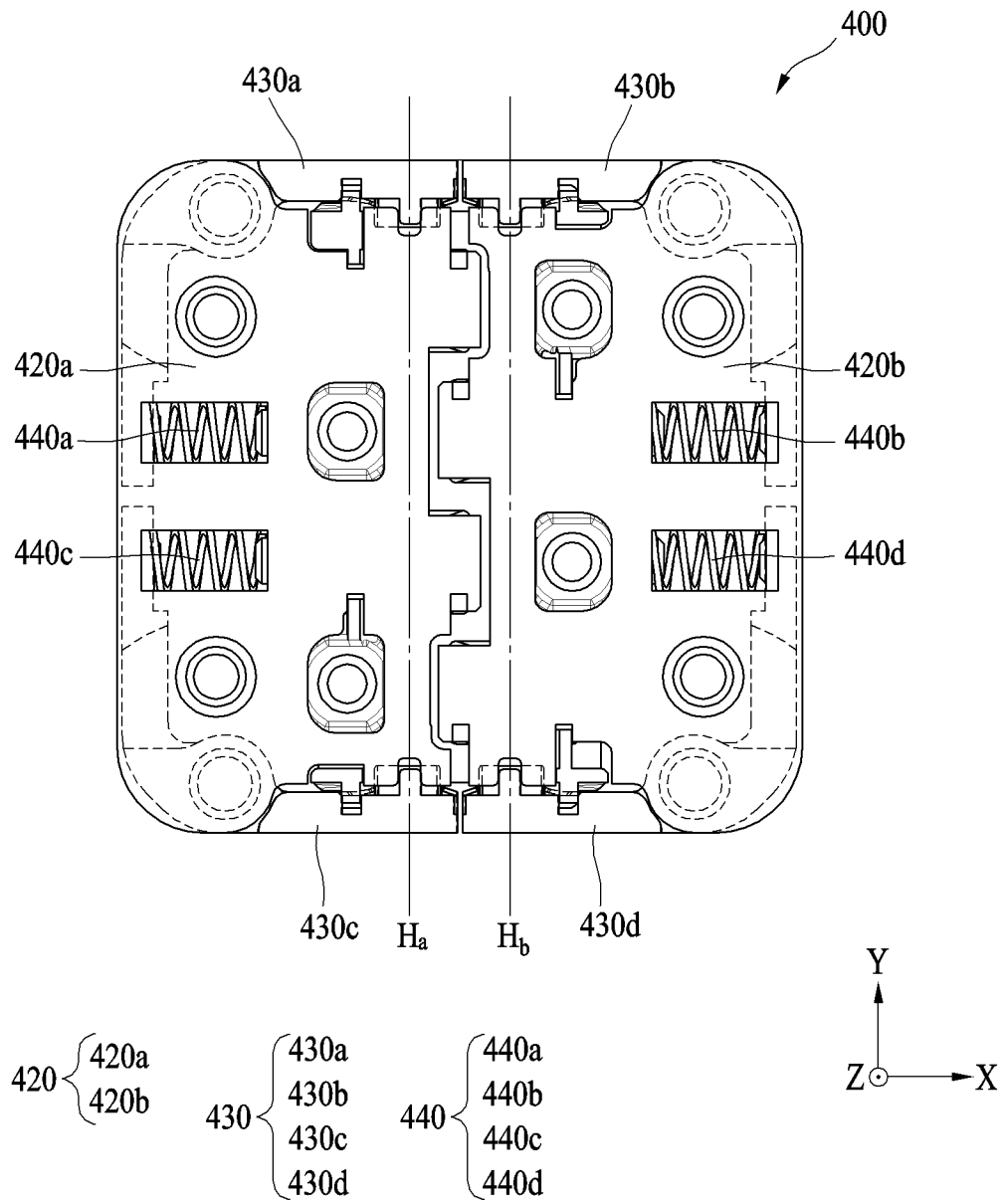
FIG. 4B is a front view illustrating an unfolded state of the hinge assembly according to an example embodiment.
Figure 4C:
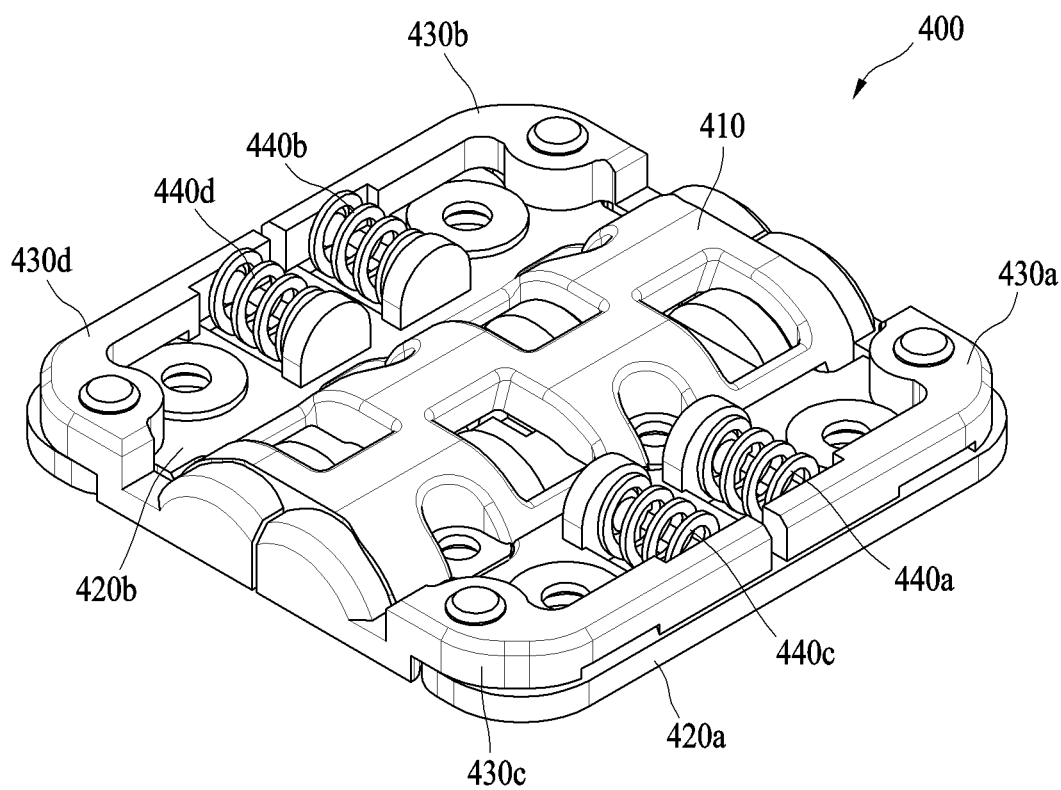
FIG. 4C is a rear perspective view illustrating an unfolded state of the hinge assembly according to an example embodiment.
Figure 4D:
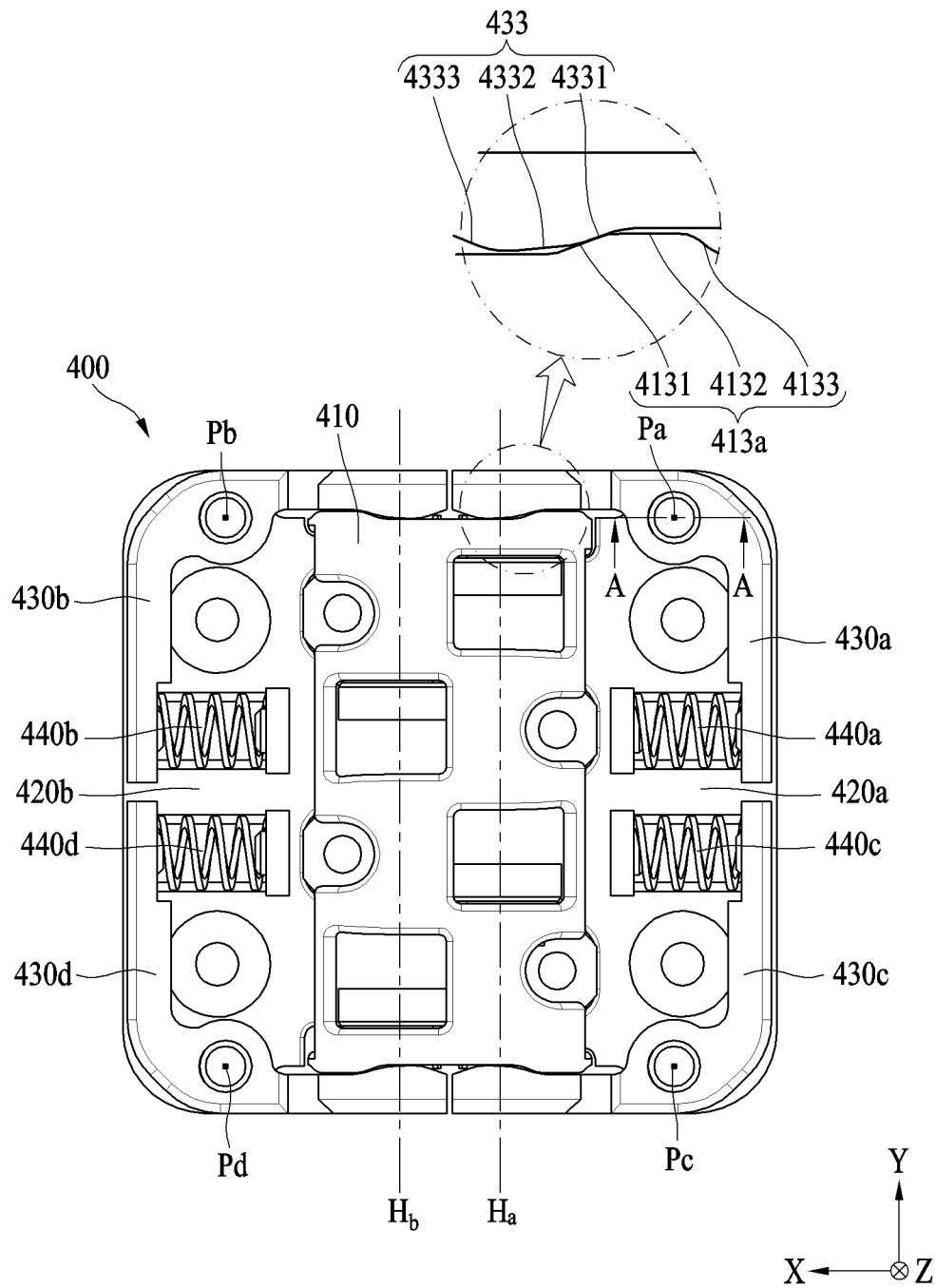
FIG. 4D is a rear view illustrating an unfolded state of the hinge assembly according to an example embodiment.
Figure 4E:
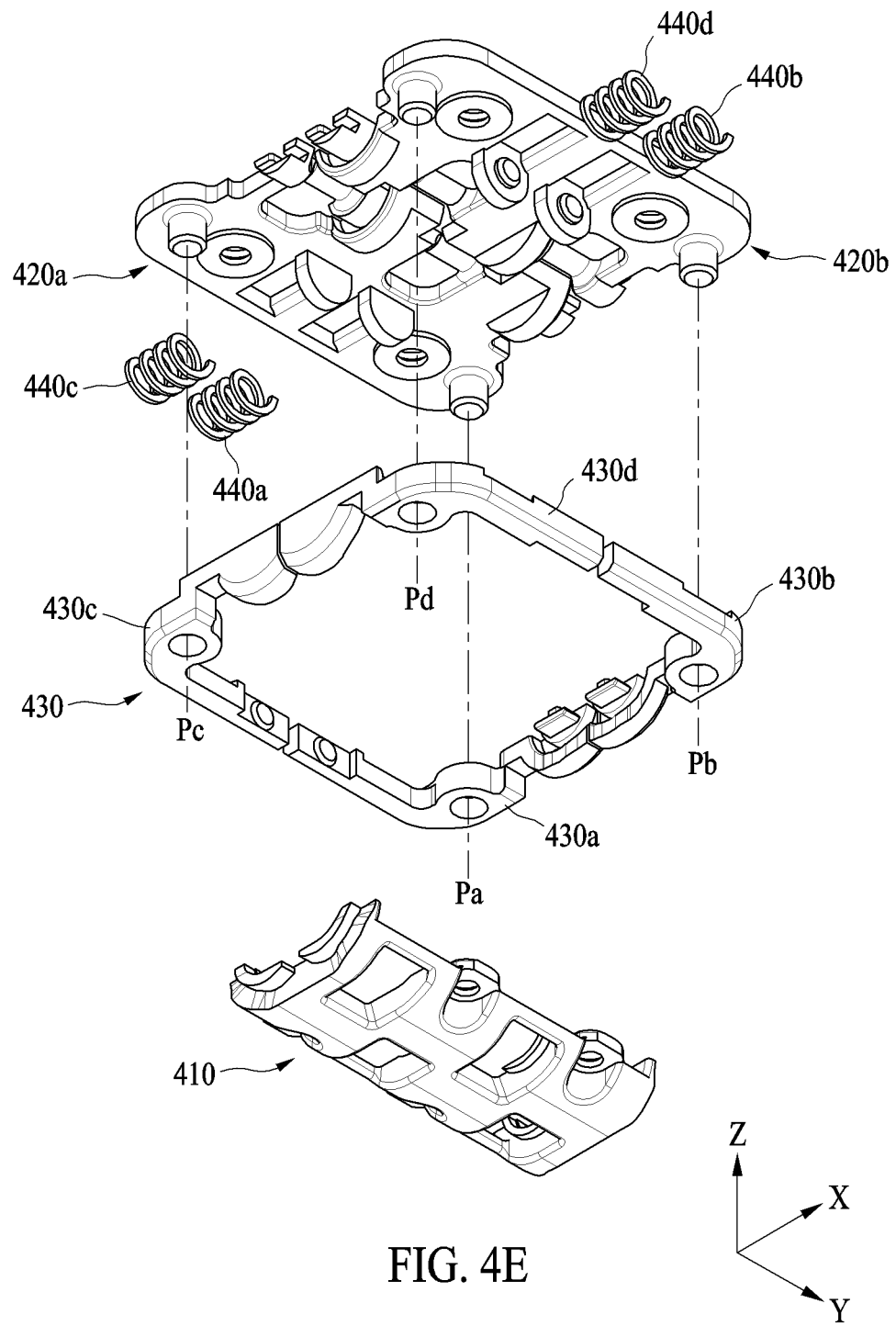
FIG. 4E is an exploded perspective view illustrating the hinge assembly according to an example embodiment.

FIG. 4A is a perspective view illustrating an unfolded state of a hinge assembly according to an example embodiment. FIG. 4B is a front view illustrating an unfolded state of the hinge assembly according to an example embodiment. FIG. 4C is a rear perspective view illustrating an unfolded state of the hinge assembly according to an example embodiment. FIG. 4D is a rear view illustrating an unfolded state of the hinge assembly according to an example embodiment. FIG. 4E is an exploded perspective view illustrating the hinge assembly according to an example embodiment.

Referring to FIGS. 4A to 4E, the hinge assembly 400 may include a hinge bracket 410, a rotator 420, an arm 430, and an elastic member 440.

Figure 4F:
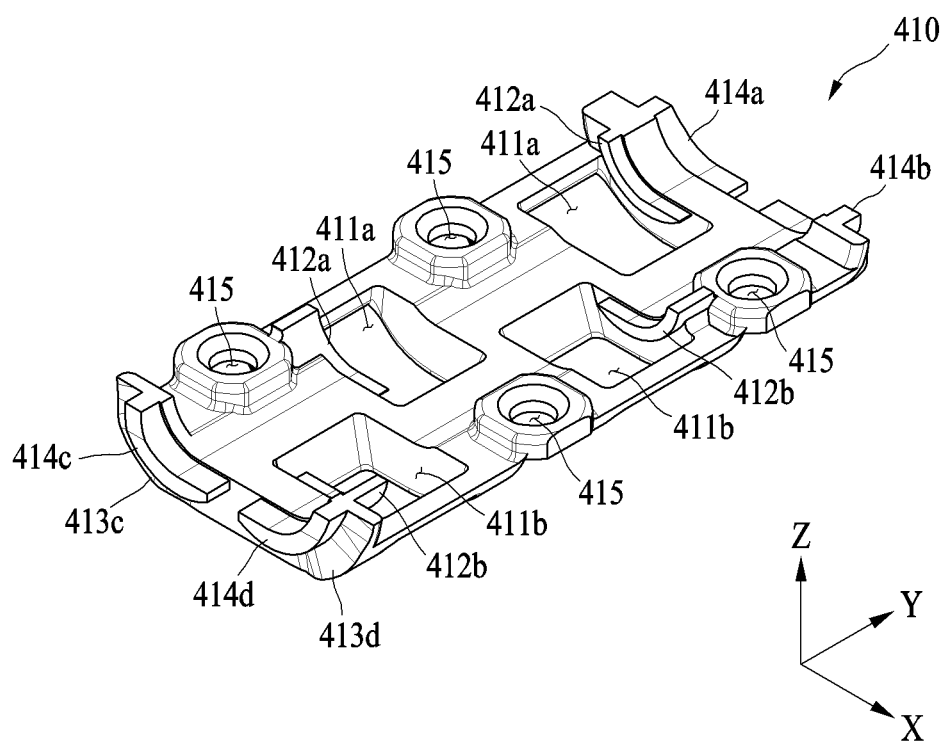
FIG. 4F is a perspective view illustrating a hinge bracket according to an example embodiment.
Figure 4G:
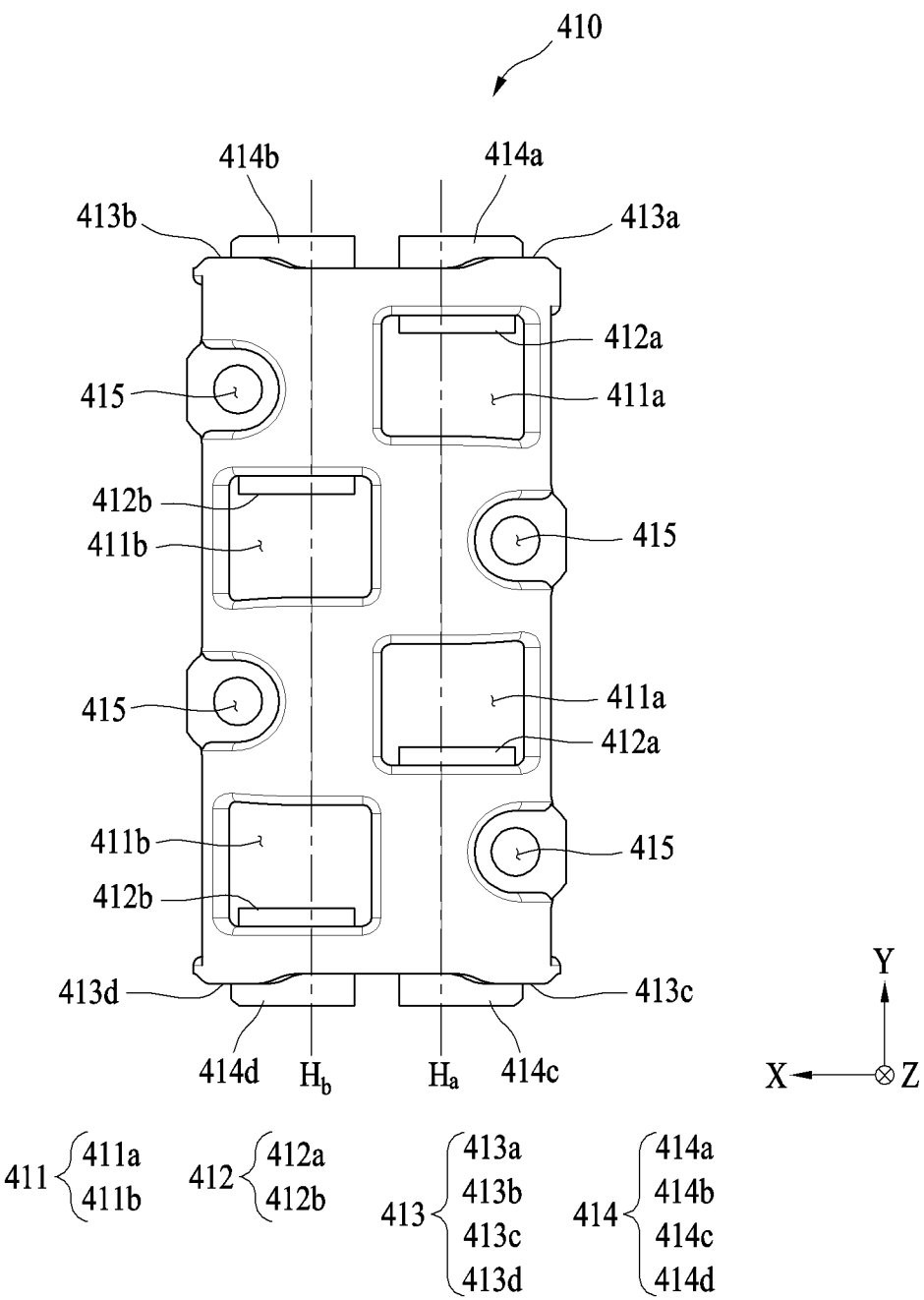
FIG. 4G is a rear view illustrating the hinge bracket according to an example embodiment.

FIG. 4F is a perspective view illustrating a hinge bracket according to an example embodiment. FIG. 4G is a rear view illustrating the hinge bracket according to an example embodiment.

Referring to FIGS. 4A to 4G, the hinge bracket 410 may be configured to fixedly connect to a housing (e.g., the housing 310 of FIG. 3). For example, the hinge bracket 410 may be fixedly connected to the hinge housing (e.g., the hinge housing 313 of FIG. 3). The hinge bracket 410 may be formed to have a longitudinal direction (e.g., the y direction) parallel with a hinge axis Ha or Hb. A lower surface (e.g., a surface in the −z direction) of the hinge bracket 410 may be formed substantially corresponding to the inner shape of the hinge housing 313.

In an example embodiment, the hinge bracket 410 may include a rotator connection space 411, a fixed rail 412, a fixed cam 413, a fixed guide rail 414, and a bracket fixing hole 415.

In an example embodiment, the rotator connection space 411 may be a space for connecting a pair of rotators 420a and 420b to the hinge bracket 410. A plurality of rotator connection spaces 411 may be formed. The rotator connection space 411 may include a first rotator connection space 411a and a second rotator connection space 411b. The first rotator connection space 411a may be a space for connecting the first rotator 420a, and the second rotator connection space 411b may be a space for connecting the second rotator 420b. With reference to FIG. 4G, the first rotator connection space 411a may be formed on the right side (e.g., a portion in the −x direction) of the hinge bracket 410 and the second rotator connection space 411b may be formed on the left side (e.g., a portion in the +x direction) of the hinge bracket 410.

In an example embodiment, a pair of first rotator connection spaces 411a and a pair of second rotator connection spaces 411b may be provided. The pair of first rotator connection spaces 411a and the pair of second rotator connection spaces 411b may be apart from one another in a longitudinal direction (e.g., the y-axis direction) of the hinge bracket 410. For example, the pair of first rotator connection spaces 411a and the pair of second rotator connection spaces 411b may be alternately disposed on one side (e.g., the −x direction side) and the other side (e.g., the +x direction side) of the hinge bracket 410 in the longitudinal direction (e.g., the y-axis direction) of the hinge bracket 410 and apart from each other. However, this is an example, and the numbers, shapes, and/or locations of the first rotator connection spaces 411a and the second rotator connection spaces 411b are not limited thereto.

In an example embodiment, the fixed rail 412 may be configured to rotatably connect the first rotator 420a and the second rotator 420b to the hinge bracket 410. The fixed rail 412 may interoperate with rotation rails (e.g., a rotation rail 422 of FIG. 4I), described below, of the first and second rotators 420a and 420b. The fixed rail 412 may include an arc shape. The center of the arc shape of the fixed rail 412 may be defined by the hinge axis Ha or Hb. For example, the fixed rail 412 may include the arc shape with the hinge axis Ha or Hb as the center. The fixed rail 412 may be formed in the rotator connection space 411. For example, the fixed rail 412 may protrude toward the hinge axis Ha or Hb in the rotator connection space 411. For example, the fixed rail 412 may include a first fixed rail 412a and a second fixed rail 412b. In the first rotator connection space 411a, the first fixed rail 412a may protrude toward the first hinge axis Ha to include the arc shape with the first hinge axis Ha as the center. For example, a pair of first fixed rails 412a may protrude in a direction facing each other. In the second rotator connection space 411b, the second fixed rail 412b may protrude toward the second hinge axis Hb to include the arc shape with the second hinge axis Hb as the center. For example, a pair of second fixed rails 412b may protrude in a direction facing each other. However, this is an example, and the number, shape, and/or location of the fixed rails 412 is not limited thereto.

In an example embodiment, a fixed cam 413 may be configured to interoperate with a rotation cam (e.g., a rotation cam 433 of FIG. 4J), described below, of the arm 430. The fixed cam 413 may be formed on an end of the hinge bracket 410. For example, the fixed cam 413 may be formed on the upper end (e.g., the +y end) and/or the lower end (e.g., the −y end) of the hinge bracket 410. The fixed cam 413 may protrude in the hinge axis Ha or Hb direction.

In an example embodiment, a plurality of fixed cams 413 may be provided. For example, the number of fixed cams 413 may correspond to the number of arms 430. For example, the fixed cam 413 may include a first fixed cam 413a, a second fixed cam 413b, a third fixed cam 413c, and a fourth fixed cam 413d. The first fixed cam 413a and the second fixed cam 413b may respectively protrude toward the first hinge axis Ha and the second hinge axis Hb from the upper end (e.g., the +y end) of the hinge bracket 410. The first fixed cam 413a may be formed in the arc with the first hinge axis Ha as the center and the second fixed cam 413b may be formed in an arc shape with the second hinge axis Hb as the center. For example, the first fixed cam 413a and the second fixed cam 413b each may include at least one crest and at least one trough. The third fixed cam 413c and the fourth fixed cam 413d may respectively protrude toward the first hinge axis Ha and the second hinge axis Hb from the lower end (e.g., the −y end) of the hinge bracket 410. The third fixed cam 413c may be formed in an arc shape with the first hinge axis Ha as the center and the fourth fixed cam 413d may be formed in an arc shape with the second hinge axis Hb as the center. For example, the third fixed cam 413c and the fourth fixed cam 413d each may include at least one crest and/or one trough structure. For example, each of the first, second, third, and fourth fixed cams 413a, 413b, 413c, and 413d may include a first surface 4131, a second surface 4132, and a third surface 4133. However, this is an example, and the number, shape, and/or location of the fixed cams 413 is not limited thereto.

In an example embodiment, the fixed guide rail 414 may guide a rotation path of the arm 430 with the hinge axis Ha or Hb as the center. The fixed guide rail 414 may interoperate with a rotation guide rail (e.g., a rotation guide rail 434 of FIG. 4J), described below, of the arm 430. The fixed guide rail 414 may include an arc shape. For example, the fixed guide rail 414 may include an arc shape with the hinge axis Ha or Hb as the center. The fixed guide rail 414 may be formed on an end of the hinge bracket 410. For example, the fixed guide rail 414 may be formed on the upper end (e.g., the +y end) and/or the lower end (e.g., the −y end) of the hinge bracket 410. The fixed guide rail 414 may protrude in the hinge axis Ha or Hb direction.

In an example embodiment, a plurality of fixed guide rails 414 may be formed. For example, the number of fixed guide rails 414 may correspond to the number of arms 430. For example, the fixed guide rail 414 may include a first fixed guide rail 414a, a second fixed guide rail 414b, a third fixed guide rail 414c, and a fourth fixed guide rail 414d. The first fixed guide rail 414a and the second fixed guide rail 414b may respectively protrude toward the first hinge axis Ha direction and the second hinge axis Hb direction from the upper end (e.g., the +y end) of the hinge bracket 410. The first fixed guide rail 414a may include an arc shape with the first hinge axis Ha as the center, and the second fixed guide rail 414b may include an arc shape with the second hinge axis Hb as the center. The first fixed guide rail 414a and the second fixed guide rail 414b may respectively protrude longer, compared to the first fixed cam 413a and the second fixed cam 413b from the upper surface (e.g., the +y surface) of the hinge bracket 410. The third fixed guide rail 414c and the fourth fixed guide rail 414d may respectively protrude toward the first hinge axis Ha and the second hinge axis Hb from the lower end (e.g., the −y end) of the hinge bracket 410. The third fixed guide rail 414c may include an arc shape with the first hinge axis Ha as the center, and the fourth fixed guide rail 414d may include an arc shape with the second hinge axis Hb as the center. The third fixed guide rail 414c and the fourth fixed guide rail 414d may respectively protrude longer, compared to the third fixed cam 413c and the fourth fixed cam 413d from the lower surface (e.g., the −y surface) of the hinge bracket 410. However, this is an example, and the number, shape, and/or location of the fixed guide rails 414 is not limited thereto.

In an example embodiment, the bracket fixing hole 415 configured to fix the hinge bracket 410 to a hinge housing (e.g., the hinge housing 313 of FIG. 3) may be formed in the hinge bracket 410. For example, a fastening member (e.g., a screw, a bolt, a pin, and/or a combination fastening structure) may be inserted into the bracket fixing hole 415. A plurality of bracket fixing holes 415 may be formed. For example, with reference to FIG. 4G, the plurality of bracket fixing holes 415 may be alternately formed on the left side (e.g., the +x side) and the right side (e.g., the −x side) of the hinge bracket 410. For example, the plurality of bracket fixing holes 415 may be alternately formed with the plurality of rotator connection spaces 411 in the longitudinal direction (e.g., the y direction) of the hinge bracket 410. However, this is an example, and the number, shape, and/or location of the bracket fixing holes 415 is not limited thereto.

Figure 4H:
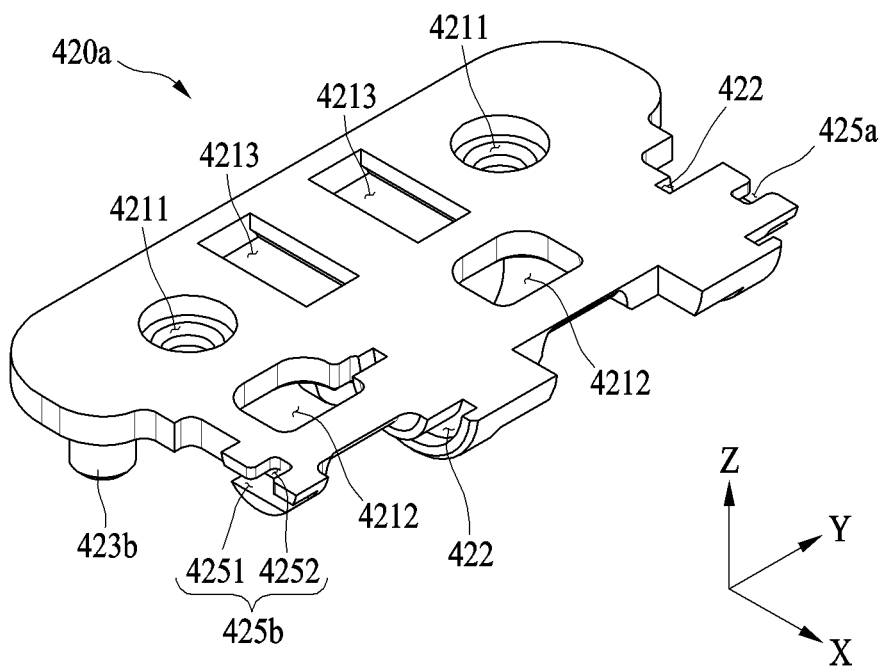
FIG. 4H is a perspective view illustrating a first rotator according to an example embodiment.
Figure 4I:
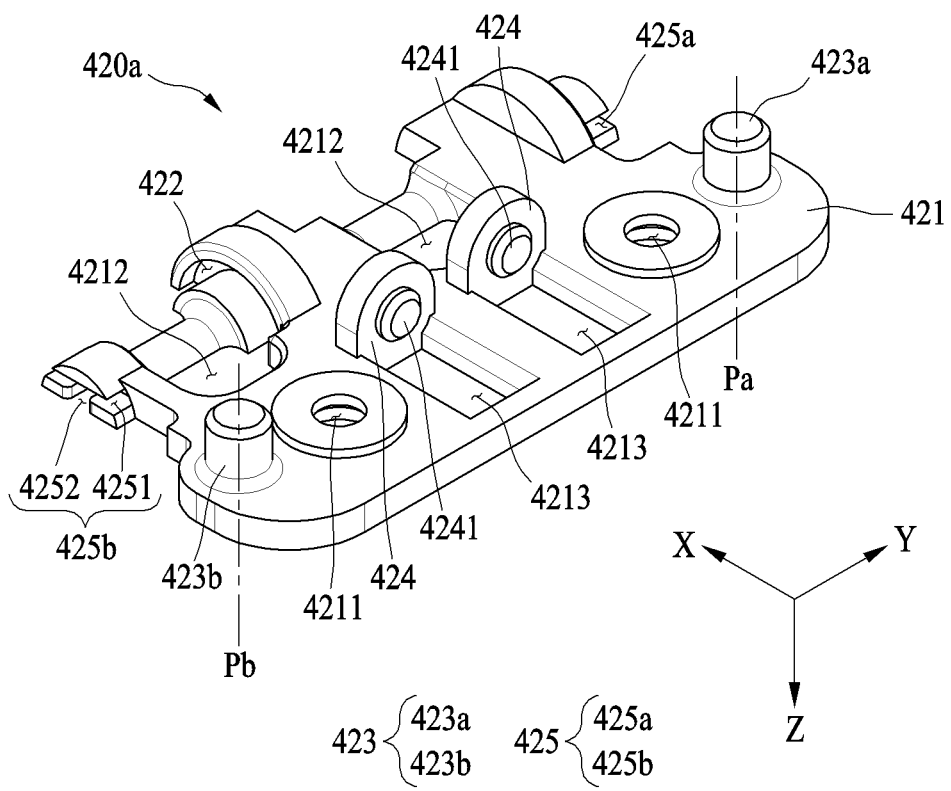
FIG. 4I is a rear perspective view illustrating the first rotator according to an example embodiment.

FIG. 4H is a perspective view illustrating a first rotator according to an example embodiment. FIG. 4I is a rear perspective view illustrating the first rotator according to an example embodiment.

Referring to FIGS. 4A to 4E, 4H, and 4I, in an example embodiment, a pair of rotators, for example, a first rotator 420a and a second rotator 420b, may be provided. The rotator 420 may include the first rotator 420a and the second rotator 420b. The pair of rotators, that is, the first and second rotators 420a and 420b, may be rotatably connected to the hinge bracket 410. For example, the first rotator 420a may be rotatably connected to the hinge bracket 410 based on the first hinge axis Ha and the second rotator 420b may be rotatably connected to the hinge bracket 410 based on the second hinge axis Hb. The first rotator 420a may be formed in a shape substantially symmetrical to the second rotator 420b. Hereinafter, for ease of description, the description of the rotator 420 is provided based on the first rotator 420a.

In an example embodiment, the first rotator 420a may include a rotator body 421, the rotation rail 422, a protruding pin 423, an elastic member support 424, and a projection insertion groove 425.

In an example embodiment, the rotator body 421 may be substantially formed in a plate shape. The rotator body 421 may be configured to fixedly connect to the first housing (e.g., the first housing 311 of FIG. 3). The rotator body 421 may be disposed in parallel with the front surface (e.g., the surface in the +z-axis direction with reference to FIG. 3) of the first housing 311.

In an example embodiment, at least one housing fixing hole 4211 for fixing the first rotator 420a to the first housing 311 may be formed in the rotator body 421. For example, the housing fixing hole 4211 may penetrate the rotator body 421 in the z-axis direction. For example, a fastening member (e.g., a screw, a bolt, a pin, and/or a combination fastening structure) may be inserted into the housing fixing hole 4211. Although two housing fixing holes 4211 are formed, as shown in FIGS. 4H and 4I, this is merely an example, and the number of housing fixing holes 4211 is not limited thereto.

In an example embodiment, a communication hole 4212 for communicating with a bracket fixing hole (e.g., the bracket fixing hole 415 of FIG. 4G) of the hinge bracket 410 may be formed in the rotator body 421. For example, when the rotator body 421 is connected to the hinge bracket 410, the communication hole 4212 may be formed at a position corresponding to the bracket fixing hole 415 to communicate with the bracket fixing hole 415. The number of communication holes 4212 may correspond to the number of bracket fixing holes 415. When the rotator body 421 is connected to the hinge bracket 410, the hinge assembly 400 may be fastened to the hinge housing 313 by inserting a fastening member (e.g., a screw, a bolt, a pin, and/or a combination fastening structure) into the communication hole 4212 and the bracket fixing hole 415.

In an example embodiment, an elastic member disposition space 4213, in which the elastic member 440 is disposed, may be formed in the rotator body 421. The elastic member disposition space 4213 may be formed in a direction (e.g., the x-axis direction) perpendicular to the first hinge axis Ha. For example, a pair of elastic member disposition spaces 4213 parallel with each other may be provided. However, this is an example, and the number, shape, and/or location of the elastic member disposition spaces 4213 is not limited thereto.

In an example embodiment, the rotation rail 422 may be configured to interoperate with the fixed rail (e.g., the fixed rail 412 of FIG. 4G) of the hinge bracket 410. The rotation rail 422 may include an arc shape with the first hinge axis Ha as the center. For example, the rotation rail 422 may include a space recessed in an arc shape with the first hinge axis Ha as the center. For example, a pair of rotation rails 422 may be formed. The pair of rotation rails 422 may be formed such that the recessed spaces are oriented in opposite directions. The first fixed rail 412a of the hinge bracket 410 may be inserted into the rotation rail 422 of the first rotator 420a. The rotation rail 422 may relatively rotate on the first hinge axis Ha with respect to the first fixed rail 412a in a designated angle range along the first fixed rail 412a. According to the structure described above, the first rotator 420a may be rotatably connected to the hinge bracket 410 with the first hinge axis Ha as the center in a designated angle range. The description and the drawings are provided based on that the rotation rail 422 is recessed and the first fixed rail 412a protrudes. However, this is an example, and the rotation rail 422 may protrude and the first fixed rail 412a may be recessed.

In an example embodiment, the protruding pin 423 may protrude from a surface of the rotator body 421. For example, the protruding pin 423 may protrude in a pin shape in the z-axis direction from the rear surface (e.g., the −z surface) of the rotator body 421. The protruding pin 423 may define a pivot axis, for example, a first pivot axis Pa or a second pivot axis Pb. The arm 430 may have the protruding pin 423 rotatably inserted therein.

In an example embodiment, a plurality of protruding pins 423 may be provided. For example, the protruding pin 423 may include a first protruding pin 423a and a second protruding pin 423b. The first protruding pin 423a and the second protruding pin 423b may be formed in a corner of the first rotator 420a. For example, with reference to FIG. 4I, the first protruding pin 423a may be formed in a corner at the right (e.g., the −x side) upper end (e.g., the +y end) of the first rotator 420a and the second protruding pin 423b may be formed in a corner at the right (e.g., the −x side) lower end (e.g., the −y end) of the first rotator 420a. For example, a first arm 430a may be connected to the first protruding pin 423a. The first arm 430a may pivot on the first pivot axis Pa, which is defined by the first protruding pin 423a, with respect to the first rotator 420a. For example, a third arm 430c may be connected to the second protruding pin 423b. The third arm 430c may pivot on the second pivot axis Pb, which is defined by the second protruding pin 423b, with respect to the second rotator 420b.

In an example embodiment, the elastic member support 424 may be configured to support the elastic member 440. The elastic member support 424 may protrude from the rear surface (e.g., the −z side surface) of the rotator body 421 to include a surface in the y-z direction. The elastic member support 424 may protrude from an end of the elastic member disposition space 4213. For example, with reference to FIG. 4I, the elastic member support 424 may be formed on one end (e.g., the +x end) of the elastic member disposition space 4213. A first support protrusion 4241 may be formed on one surface (e.g., the −x side surface) of the elastic member support 424. The first support protrusion 4241 may be a protrusion configured to support the elastic member 440 by inserting the elastic member 440 into the protrusion. The number of elastic member supports 424 may correspond to the number of elastic member disposition spaces 4213. For example, a pair of elastic member supports 424 may be provided. However, this is an example, and the number, shape, and/or location of the elastic member supports 424 is not limited thereto.

In an example embodiment, a protrusion (e.g., a protrusion 436 of FIG. 4J) formed in the arm 430 may be inserted into the protrusion insertion groove 425. The protrusion insertion groove 425 may be formed in both ends (e.g., the ends in +y and −y) of the rotator body 421. The protrusion insertion groove 425 may include a first protrusion insertion groove 425a and a second protrusion insertion groove 425b. For example, with reference to FIG. 4I, the first protrusion insertion groove 425a may be formed on the left (e.g., the +x side) upper end (e.g., the +y end) of the rotator body 421 and the second protrusion insertion groove 425b may be formed on the left (e.g., the +x side) lower end (e.g., the −y end) of the rotator body 421.

In an example embodiment, the protrusion insertion groove 425 may be formed in a shape substantially corresponding to the protrusion (e.g., the protrusion 436 of FIG. 4J) of the arm 430. The first protrusion insertion groove 425a and the second protrusion insertion groove 425b may include a horizontal protrusion insertion groove 4251 and a vertical protrusion insertion groove 4252. The horizontal protrusion insertion groove 4251 may be formed in the horizontal direction (e.g., the x direction). The vertical protrusion insertion groove 4251 may be formed in the vertical direction (e.g., the z direction) to communicate with the horizontal protrusion insertion groove 4251.

In an example embodiment, the second rotator 420b may be substantially symmetrical to the first rotator 420a. A detailed description of the second rotator 420b has been omitted to avoid excessive repetition.

Figure 4J:
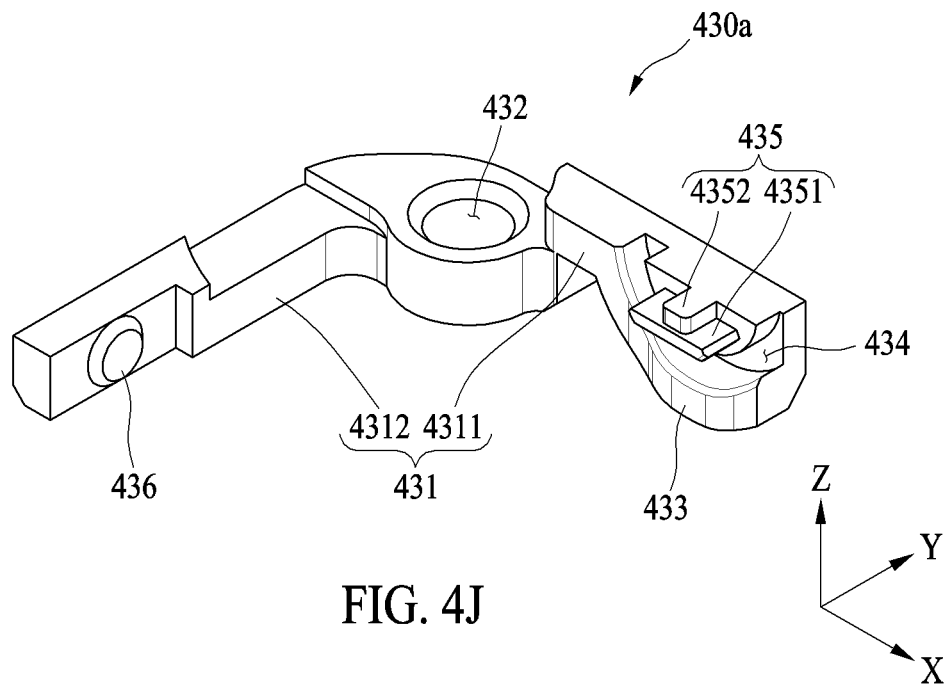
FIG. 4J is a perspective view illustrating a first arm according to an example embodiment.
Figure 4K:
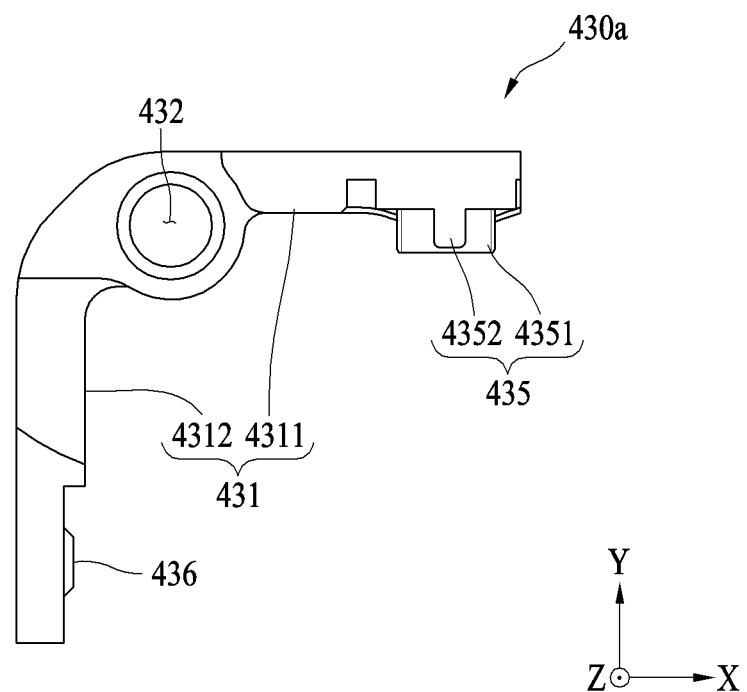
FIG. 4K is a plan view illustrating the first arm according to an example embodiment.
Figure 4L:
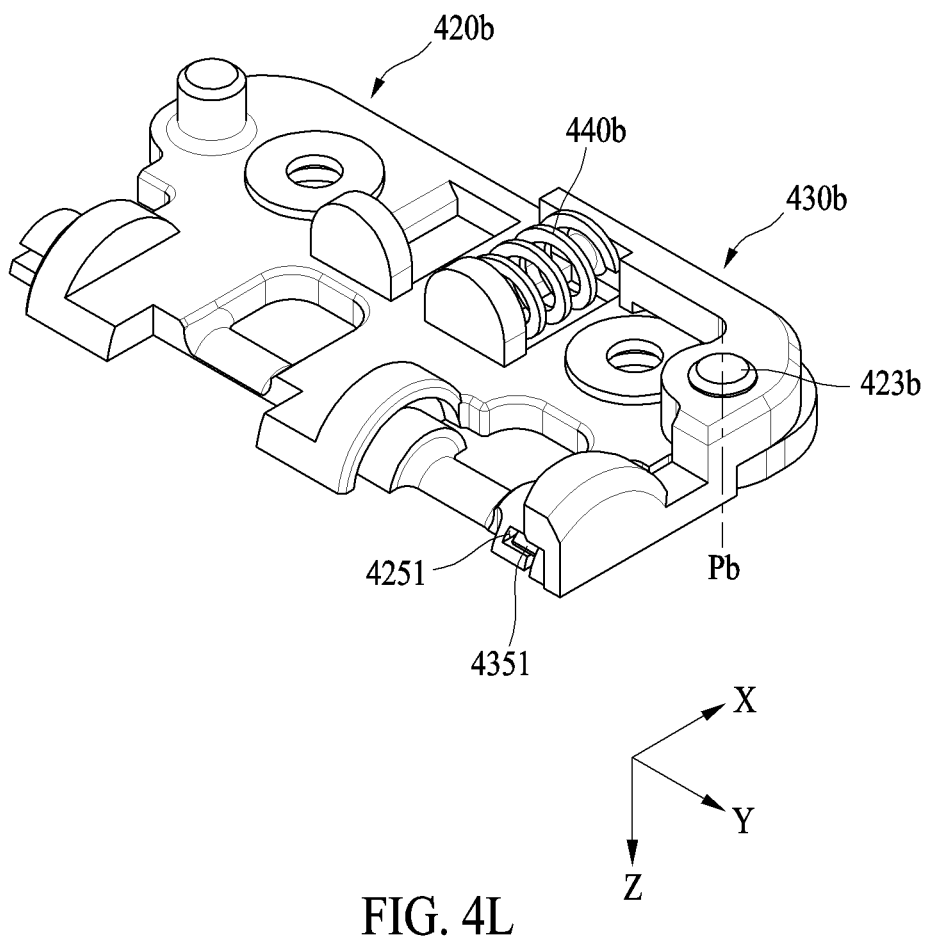
FIG. 4L is a rear perspective view illustrating a state in which a second arm is connected to a second rotator, according to an example embodiment.
Figure 4M:
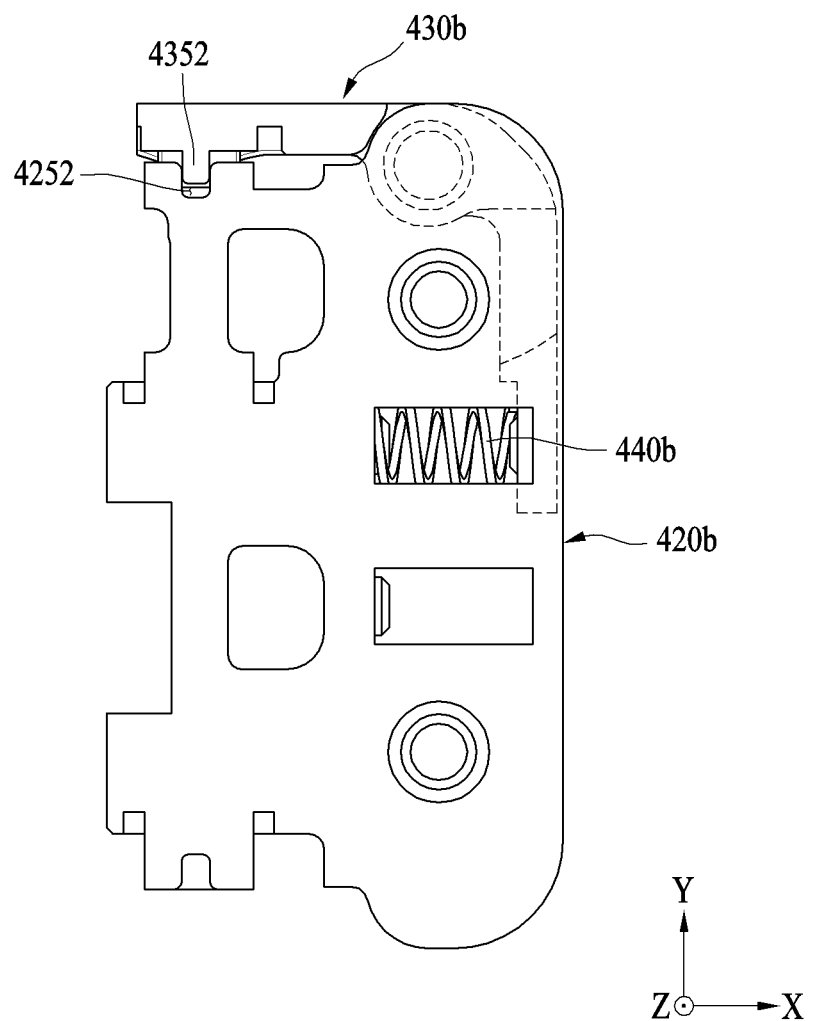
FIG. 4M is a front view illustrating a state in which the second arm is connected to the second rotator, according to an example embodiment.

FIG. 4J is a perspective view illustrating a first arm according to an example embodiment. FIG. 4K is a plan view illustrating the first arm according to an example embodiment.

Referring to FIGS. 4A to 4E, 4J, and 4K, in an example embodiment, the arm 430 may be pivotably connected to the first or second rotator 420a or 420b. At least a pair of arms 430 may be provided. For example, two pairs of arms 430 may be provided. For example, the arm 430 may include the first arm 430a, a second arm 430b, the third arm 430c, and a fourth arm 430d. The first arm 430a and the third arm 430c may be pivotably connected to the first rotator 420a, based on the first pivot axis Pa and the second pivot axis Pb, and the second arm 430b and the fourth arm 430d may be pivotably connected to the second rotator 420b, based on a third pivot axis Pc and a fourth pivot axis Pd. Hereinafter, for ease of description, the description of the arm 430 is provided based on the first arm 430a.

In an example embodiment, the first arm 430a may include an arm body 431, a pin hole 432, the rotation cam 433, the rotation guide rail 434, a protrusion 435, and the second support protrusion 436.

In an example embodiment, the arm body 431 may form an external figure of the first arm 430a. The arm body 431 may be formed in a bent shape. For example, the arm body 431 may be substantially formed in an "L" shape. The arm body 431 may include a main body 4311 and a bent body 4312. The main body 4311 may extend to have a longitudinal direction (e.g., the x direction). The bent body 4312 may be bent from one side (e.g., the −x side) of the main body 4311. The bent body 4312 may extend in a direction (e.g., the y direction) substantially perpendicular to the longitudinal direction (e.g., the x direction) of the main body 4311. The first arm 430a may be positioned such that the main body 4311 extends in a direction (e.g., the x direction) from the first pivot axis Pa and the bent body 4312 extends in another direction (e.g., the y direction) from the first pivot axis Pa.

In an example embodiment, the pin hole 432 may be a hole into which a protruding pin (e.g., the protruding pin 423 of FIG. 4I) of the first or second rotator 420a or 420b is inserted. For example, the pin hole 432 of the first arm 430a may be a hole into which the first protruding pin 423a of the first rotator 420a is inserted. The pin hole 432 may be formed in a portion where the arm body 431 is substantially bent. For example, the pin hole 432 may penetrate the portion where the arm body 431 is bent in the z-axis direction.

In an example embodiment, the rotation cam 433 may interoperate with a fixed cam (e.g., the fixed cam 413 of FIG. 4G) of the hinge bracket 410. The rotation cam 433 may be formed on one end (e.g., the +x end) of the main body 4311. For example, the rotation cam 433 may protrude in the −y direction from one end (e.g., the +x end) of the main body 4311. The rotation cam 433 may be formed along the arc shape with the hinge axis Ha as the center. For example, the rotation cam 433 may include at least one crest and/or one trough structure. For example, the rotation cam 433 may include a fourth surface 4331, a fifth surface 4332, and a sixth surface 4333.

In an example embodiment, the rotation guide rail 434 may interoperate with a fixed guide rail (e.g., the fixed guide rail 414 of FIG. 4G) of the hinge bracket 410. The rotation guide rail 434 may be formed on one end (e.g., the +x end) of the main body 4311. For example, the rotation guide rail 434 may be recessed in one end (e.g., the +x end) of the main body 4311. The rotation guide rail 434 may be formed at a location adjacent to the rotation cam 433. For example, the rotation guide rail 434 may be formed on the side (e.g., the +z side) upper than the rotation cam 433. The rotation guide rail 434 may include an arc shape with the first hinge axis Ha as the center. For example, the rotation guide rail 434 may include a space recessed in the arc shape with the first hinge axis Ha as the center. For example, the rotation guide rail 434 of the first arm 430a may be rotatably connected to a first fixed guide rail (e.g., the first fixed guide rail 414a of FIG. 4G) based on the first hinge axis Ha. For example, the first fixed guide rail 414a may be inserted into a recessed space of the rotation guide rail 434. The rotation guide rail 434 may relatively rotate on the first hinge axis Ha with respect to the first fixed guide rail 414a in a designated angle range along the first fixed guide rail 414a. According to the structure described above, when the first rotator 420a rotates on the first hinge axis Ha with respect to the hinge bracket 410 in a designated angle range, a rotation path, of the first arm 430*a*, with the first hinge axis Ha as the center may be guided by the rotation guide rail 434 and the first fixed guide rail 414*a*. During the process in which the rotation cam 433 interoperates with the fixed cam (e.g., the fixed cam 413 of FIG. 4G), since the rotation path of the arm 430 is guided by the rotation guide rail 434 adjacent to the rotation cam 433, a gap occurring in interoperation of the rotation cam 433 with the fixed cam 413 may decrease. Accordingly, a force generated when the rotation cam 433 interoperates with the fixed cam 413 may be transmitted and a driving sound occurring when the hinge assembly 400 operates may decrease. The description and the drawings are provided based on that the rotation guide rail 434 is recessed and the first fixed guide rail 414*a* protrudes. However, this is an example, and the rotation guide rail 434 may protrude and the first fixed guide rail 414*a* may be recessed.

In an example embodiment, the protrusion 435 may be formed on one end (e.g., the +x end) of the main body 4311. For example, the protrusion 435 may protrude from one end (e.g., the +x end) of the main body 4311. For example, the protrusion 435 may be formed on the side (e.g., the +z side) upper than the rotation guide rail 434. The protrusion 435 may be inserted into the protrusion insertion groove 425 of the first or second rotator 420*a* or 420*b*. For example, after the protrusion 435 is inserted into the first protruding pin 423*a* of the first rotator 420*a* while the protrusion 435 does not interfere with the first protrusion insertion groove 425*a*, the first arm 430*a* may rotate on the first protruding pin 423*a* to insert the protrusion 435 into the first protrusion insertion groove 425*a*.

In an example embodiment, the protrusion 435 may include a horizontal protrusion 4351 and a vertical protrusion 4352. The horizontal protrusion 4351 may protrude in the horizontal direction (e.g., the x direction). The vertical protrusion 4352 may protrude in the vertical direction (e.g., the z direction) from the horizontal protrusion 4351. The horizontal protrusion 4351 may be inserted into a horizontal protrusion insertion groove (e.g., the horizontal protrusion insertion groove 4251 of FIG. 4I). The vertical protrusion 4352 may be inserted into a vertical protrusion insertion groove (e.g., the vertical protrusion insertion groove 4252 of FIG. 4I).

In an example embodiment, the second support protrusion 436 may protrude in the +x-axis direction from one end (e.g., the end in the −y direction) of the bent body 4312. The second support protrusion 436 may be a protrusion configured to support the elastic member 440 by inserting the elastic member 440 into the protrusion.

In an example embodiment, the second arm 430*b*, the third arm 430*c*, and/or the fourth arm 430*d* may be substantially the same or symmetrical to the first arm 430*a*. A detailed description of the second arm 430*b*, the third arm 430*c*, and/or the fourth arm 430*d* has been omitted to avoid excessive repetition.

FIG. 4 is a rear perspective view illustrating a state in which a second arm is connected to a second rotator, according to an example embodiment. FIG. 4M is a front view illustrating a state in which the second arm is connected to the second rotator, according to an example embodiment.

Referring to FIGS. 4A to 4E and 4H to 4M, in an example embodiment, the arm 430 may be prevented from escaping from the first or second rotator 420*a* or 420*b* by inserting the protrusion 435 into the protrusion insertion groove 425. For example, the second arm 430*b* may be prevented from escaping from the second protruding pin 423*b* with respect to the second rotator 420*b* by inserting the protrusion 435 of the second arm 430*b* into the protrusion insertion groove 425 of the second rotator 420*b*. For example, the second arm 430*b* may be prevented from escaping in the second pivot axis Pb direction from the second rotator 420*b* by the coupling of the horizontal protrusion 4351 and the horizontal protrusion insertion groove 4251. For example, the second arm 430*b* may be prevented from escaping in the horizontal direction (e.g., the x direction) perpendicular to the second pivot axis Pb from the second rotator 420*b* by the coupling of the vertical protrusion 4352 and the vertical protrusion insertion groove 4252. According to the structure described above, when rotatably connecting the arm 430 to the first or second rotator 420*a* or 420*b*, a separate member (e.g., a pin member or a screw member) may not be used, and thus, the number of components may decrease. On the other hand, in an example embodiment, the arm 430 and the rotator 420 may be rotatably connected to each other through a separate pin member or a separate screw member.

Referring to FIGS. 4A to 4E, in an example embodiment, the elastic member 440 may be disposed between the rotator 420 and the arm 430 and may generate an elastic force. The elastic member 440 may be disposed perpendicular to the hinge axis Ha or Hb. The elastic member 440 may be disposed in an elastic member disposition space (e.g., the elastic member disposition space 4213 of FIG. 4I) of the rotator 420. For example, one side of the elastic member 440 may be supported by a first support protrusion (e.g., the first support protrusion 4241 of FIG. 4I) of the rotator 420 and the other side of the elastic member 440 may be supported by a second support protrusion (e.g., the second support protrusion 436 of FIG. 4J) of the arm 430. The elastic member 440 may provide an elastic force to a bent body (e.g., the bent body 4312 of FIG. 4K) such that the rotation cam (e.g., the rotation cam 433 of FIG. 4J) is pressed with respect to the fixed cam (e.g., the fixed cam 413 of FIG. 4G).

In an example embodiment, a plurality of elastic members 440 may be provided. The number of elastic members 440 may correspond to the number of arms 430. For example, the elastic member 440 may include a first elastic member 440*a*, a second elastic member 440*b*, a third elastic member 440*c*, and a fourth elastic member 440*d*. The first elastic member 440*a*, the second elastic member 440*b*, the third elastic member 440*c*, and the fourth elastic member 440*d* may be disposed to press the first arm 430*a*, the second arm 430*b*, the third arm 430*c*, and the fourth arm 430*d*, respectively.

Figure 4N:
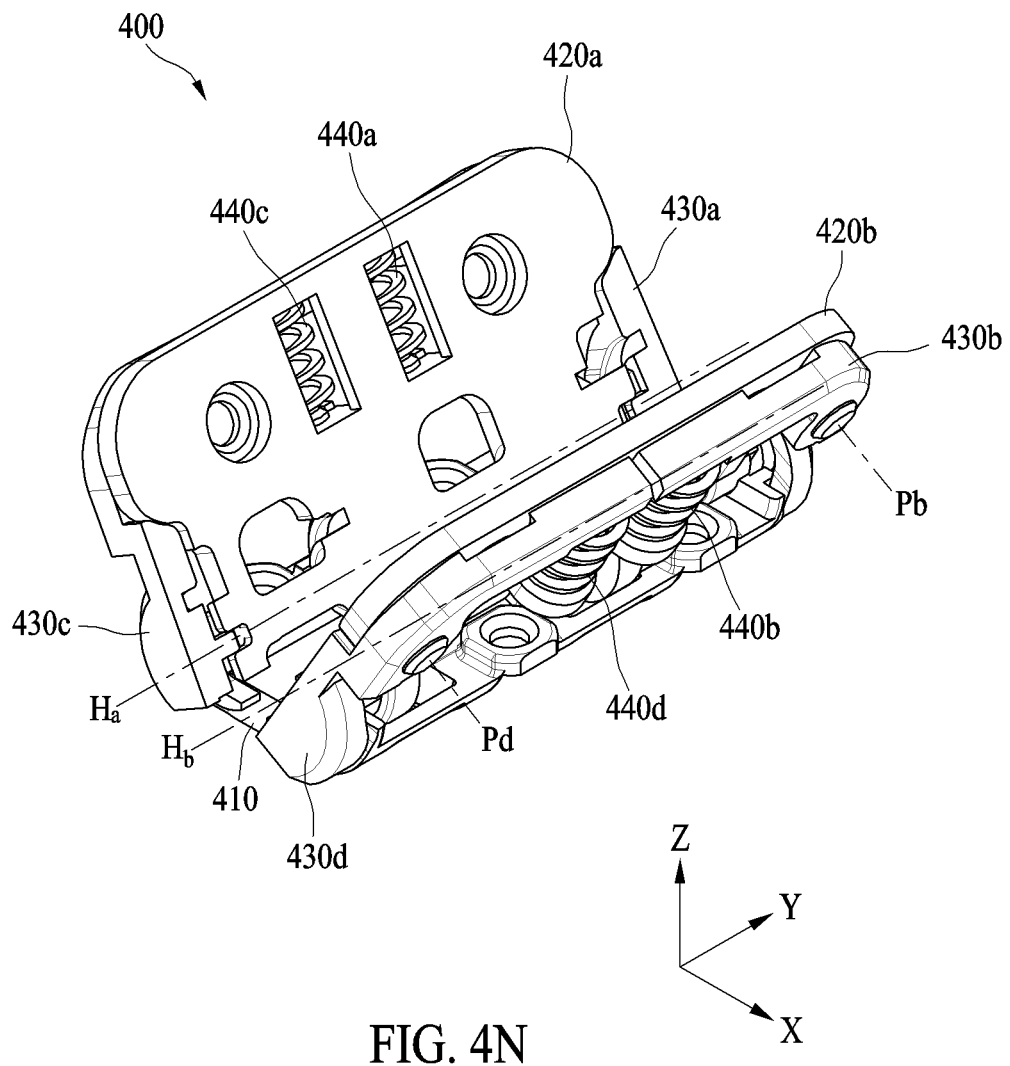
FIG. 4N is a perspective view illustrating an intermediate state of the hinge assembly according to an example embodiment.
Figure 4O:
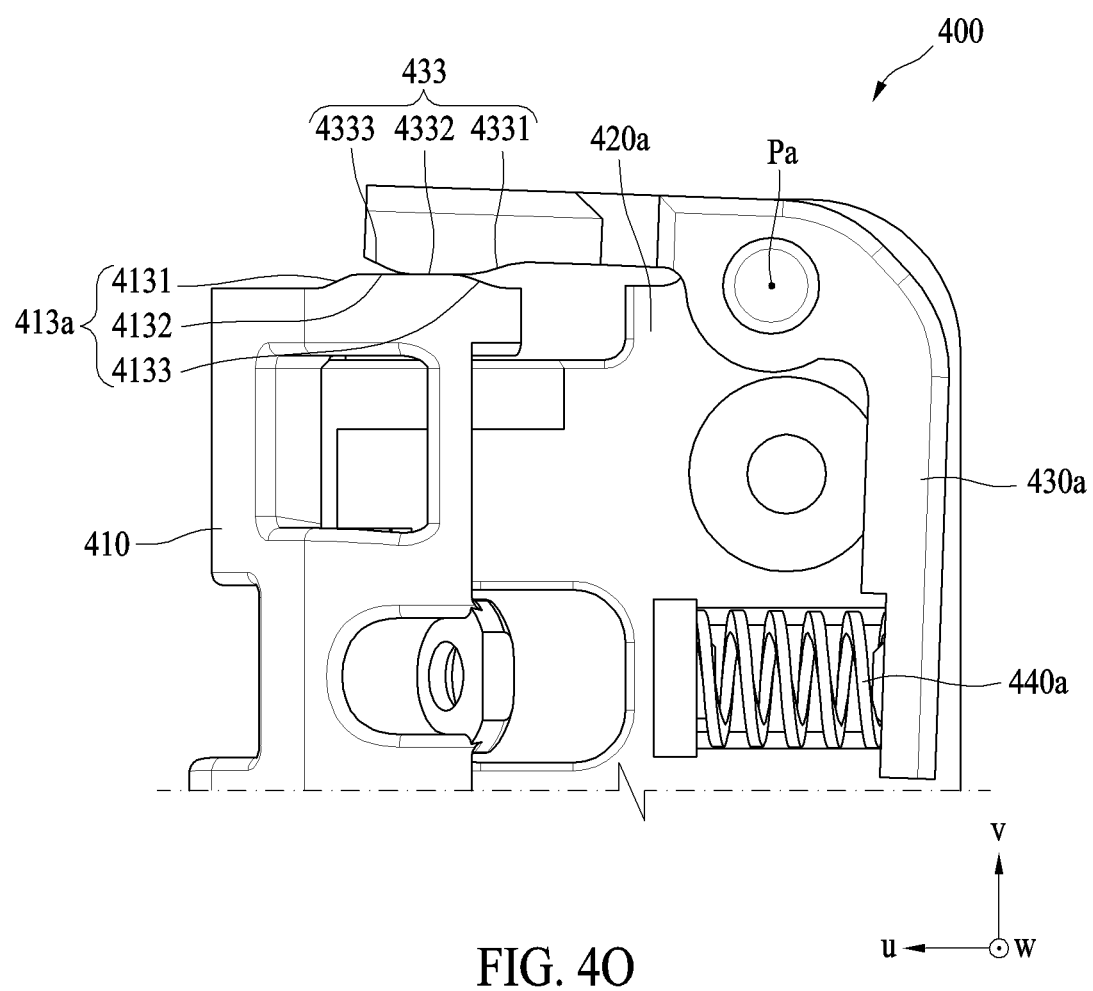
FIG. 4O is a side view illustrating an intermediate state of the hinge assembly according to an example embodiment.
Figure 4P:
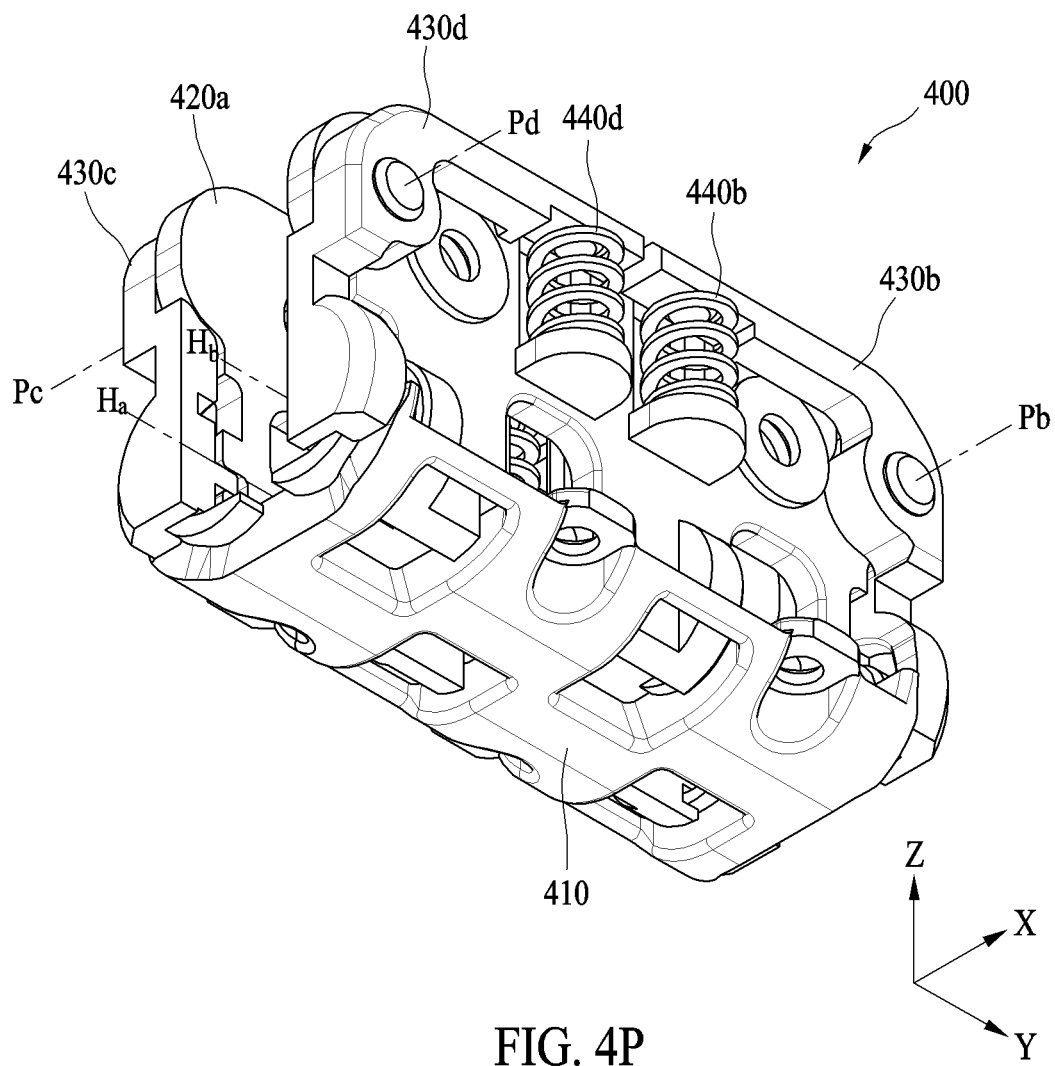
FIG. 4P is a perspective view illustrating a folded state of the hinge assembly according to an example embodiment.
Figure 4Q:
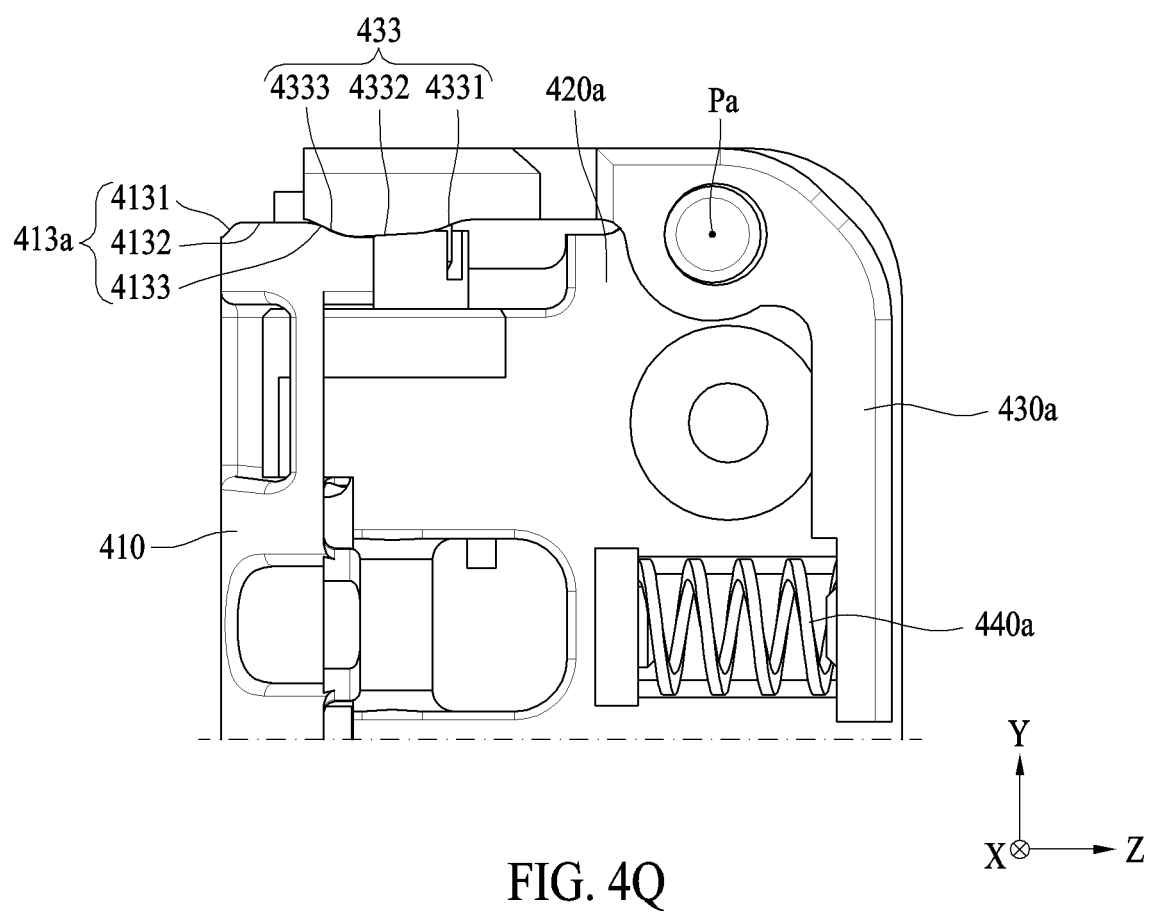
FIG. 4Q is a side view illustrating a folded state of the hinge assembly according to an example embodiment.
Figure 4R:
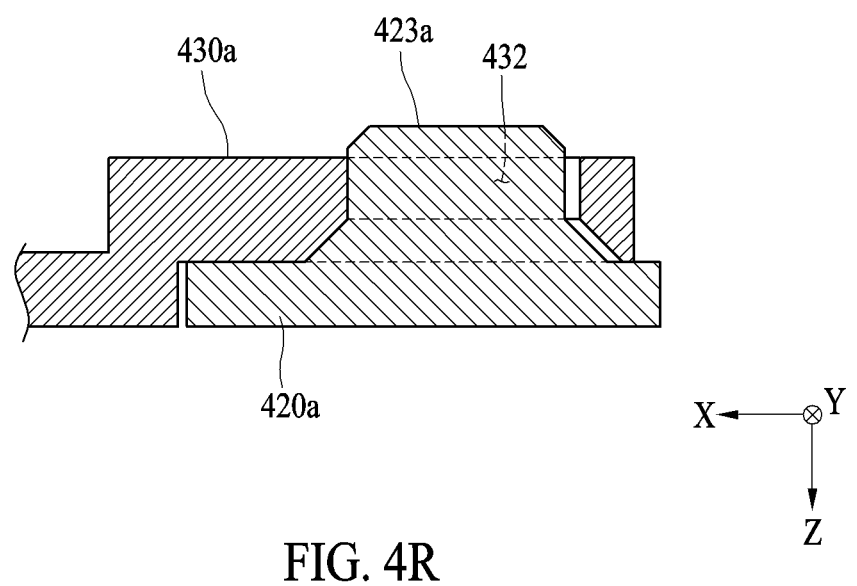
FIG. 4R is a cross-sectional view taken along line A-A of FIG. 4D.

FIG. 4N is a perspective view illustrating an intermediate state of the hinge assembly according to an example embodiment. FIG. 4O is a side view illustrating an intermediate state of the hinge assembly according to an example embodiment. FIG. 4P is a perspective view illustrating a folded state of the hinge assembly according to an example embodiment. FIG. 4Q is a side view illustrating a folded state of the hinge assembly according to an example embodiment. FIG. 4R is a cross-sectional view taken along line A-A of FIG. 4D.

Referring to FIGS. 4A to 4D and 4N to 4Q, as the first rotator 420*a* and the second rotator 420*b* respectively rotate on the hinge axes Ha and Hb with respect to the hinge bracket 410, the hinge assembly 400 may be in an unfolded state (e.g., FIG. 4A) or a folded state (e.g., FIG. 4P). While the first or second rotator 420*a* or 420*b* is folded or unfolded based on the hinge axis Ha or Hb, the arm 430*a*, 430*b*, 430*c*, or 430*d* may pivot on the pivot axis Pa, Pb, Pc, or Pd with respect to the first or second rotator 420*a* or 420*b*. While the first or second rotator 420*a* or 420*b* is folded or unfolded based on the hinge axis Ha or Hb, the fixed cam 413 and the rotation cam 433 may generate a force (e.g., a friction force)

to maintain the hinge assembly 400 to be in a predetermined state by interoperating with each other. Hereinafter, for ease of description, interoperation of the fixed cam 413 with the rotation cam 433 is described based on the first arm 430*a*.

In an example embodiment, when the first arm 430*a* is coupled to a first protruding pin (e.g., the first protruding pin 423*a* of FIG. 4I) of the first rotator 420*a*, the rotation cam 433 of the first arm 430*a* may interoperate with the first fixed cam 413*a* of the hinge bracket 410. As shown in FIGS. 4A to 4D, when the hinge assembly 400 is in the unfolded state, the rotation cam 433 may be disposed to engage with the first fixed cam 413*a*. For example, when the hinge assembly 400 is in the unfolded state, the rotation cam 433 and the first fixed cam 413*a* may be disposed such that a crest of the rotation cam 433 engages with a crest of the first fixed cam 413*a*. For example, when the hinge assembly 400 is in the unfolded state, the fourth surface 4331 of the rotation cam 433 may contact the first surface 4131 of the first fixed cam 413*a*. The elastic force provided by the first elastic member 440*a* may generate a torque centered on the first pivot axis Pa in the first arm 430*a* and the generated torque may be transmitted between the fourth surface 4331 of the rotation cam 433 and the first surface 4131 of the first fixed cam 413*a*. A pressing force between the fourth surface 4331 of the rotation cam 433 and the first surface 4131 of the first fixed cam 413*a* may generate a force (e.g., a friction force or a torque) to maintain the hinge assembly 400 to be in the unfolded state. The pressing force between the fourth surface 4331 of the rotation cam 433 and the first surface 4131 of the first fixed cam 413*a* may function as a pressing force to change a partially unfolded state to a fully unfolded state. For example, the pressing force between the fourth surface 4331 of the rotation cam 433 and the first surface 4131 of the first fixed cam 413*a* may function as a pressing force to automatically and fully unfold the hinge assembly 400 when the hinge assembly 400 is in a designated angle range close to the fully unfolded state.

In an example embodiment, referring to FIGS. 4N and 4O, in an intermediate state in which the first rotator 420*a* rotates on the first hinge axis Ha in a designated angle with respect to the hinge bracket 410, the rotation cam 433 and the first fixed cam 413*a* may be disposed to engage with each other in front. For example, when the hinge assembly 400 is in the intermediate state, a crest of the rotation cam 433 and a crest of the first fixed cam 413*a* may be engaged with each other. For example, when the hinge assembly 400 is in the intermediate state, the fifth surface 4332 of the rotation cam 433 may contact the second surface 4132 of the first fixed cam 413*a*. When the hinge assembly 400 switches from the unfolded state to the intermediate state, as the rotation cam 433 rides up the first fixed cam 413*a*, the first arm 430*a* may pivot on the first pivot axis Pa in a designated angle with respect to the first rotator 420*a*. The elastic force provided by the first elastic member 440*a* may generate a torque centered on the first pivot axis Pa in the first arm 430*a* and the generated torque may be transmitted between the fifth surface 4332 of the rotation cam 433 and the second surface 4132 of the first fixed cam 413*a*. The pressing force between the fifth surface 4332 of the rotation cam 433 and the second surface 4132 of the first fixed cam 413*a* may generate a force (e.g., a friction force or a torque) to maintain the hinge assembly 400 to be in the intermediate state. In addition, to transmit a sufficient pressing force between the fifth surface 4332 of the rotation cam 433 and the second surface 4132 of the first fixed cam 413*a*, the fifth surface 4332 of the rotation cam 433 may be in surface contact with the second surface 4132 of the first fixed cam 413*a* while the first arm 430*a* pivots on the first pivot axis Pa. For this, at least one of the fifth surface 4332 of the rotation cam 433 and the second surface 4132 of the first fixed cam 413*a* may be relatively inclinedly formed. For example, referring to FIG. 4D, based on the unfolded state, the second surface 4132 of the first fixed cam 413*a* may be formed to be parallel with the x direction and the fifth surface 4332 of the rotation cam 433 may be inclinedly (e.g., upwardly inclined in the +x direction) formed with respect to the x direction. However, this is an example, and the fifth surface 4332 of the rotation cam 433 may be formed to be parallel with the x direction and the second surface 4132 of the first fixed cam 413*a* may be inclinedly (e.g., downwardly inclined in the +x direction) formed with respect to the x direction.

In an example embodiment, referring to FIGS. 4P and 4Q, when the hinge assembly 400 is in the folded state, the rotation cam 433 may engage with the first fixed cam 413*a*. For example, when the hinge assembly 400 is in the folded state, a crest of the rotation cam 433 and a crest of the first fixed cam 413*a* may engage with each other. For example, when the hinge assembly 400 is in the folded state, the sixth surface 4333 of the rotation cam 433 may contact the third surface 4133 of the first fixed cam 413*a*. When the hinge assembly 400 switches from the intermediate state to the folded state, as the rotation cam 433 rides down on the first fixed cam 413*a*, the first arm 430*a* pivoted on the first pivot axis Pa may return to the original position. The elastic force provided by the first elastic member 440*a* may generate a torque centered on the first pivot axis Pa in the first arm 430*a* and the generated torque may be transmitted between the sixth surface 4333 of the rotation cam 433 and the third surface 4133 of the first fixed cam 413*a*. The pressing force between the sixth surface 4333 of the rotation cam 433 and the third surface 4133 of the first fixed cam 413*a* may generate a force (e.g., a friction force or a torque) to maintain the hinge assembly 400 to be in the folded state. The pressing force between the sixth surface 4333 of the rotation cam 433 and the third surface 4133 of the first fixed cam 413*a* may function as a pressing force to change a partially folded state into a fully folded state. For example, the pressing force between the sixth surface 4333 of the rotation cam 433 and the third surface 4133 of the first fixed cam 413*a* may function as a pressing force to automatically and fully fold the hinge assembly 400 when the hinge assembly 400 is in a designated angle range close to the fully folded state.

In an example embodiment, as described above, a detent or free stop to maintain the hinge assembly 400 to be in a predetermined state may be implemented by disposing the elastic member 440 to be perpendicular to the hinge axis Ha or Hb and pivotably forming the arm 430 with a bent structure. In addition, by disposing the elastic member 440 to be perpendicular to the hinge axis Ha or Hb, the total length (e.g., the length in the z direction) of the hinge assembly 400 may decrease and furthermore, the total weight of the hinge assembly 400 may decrease.

In an example embodiment, referring to FIGS. 4D and 4R, a gap may occur between the first protruding pin 423*a* and the pin hole 432. Since the first arm 430*a* is pressed in a direction (e.g., the −x direction) by the elastic force provided by the first elastic member 440*a*, the first arm 430*a* may be relatively moved in a direction (e.g., the −x direction) with respect to the first rotator 420*a* in the gap between the first protruding pin 423*a* and the pin hole 432. Accordingly, since the first protruding pin 423*a* is maintained to be in a designated position in the pin hole 432 by interoperation of the rotation cam 433 with the first fixed cam 413*a* during folding or unfolding operations of the first rotator 420a, a driving sound that occurs during driving may decrease.

In an example embodiment, the second arm 430b, the third arm 430c, and the fourth arm 430d may respectively interoperate with the second fixed cam 413b, the third fixed cam 413c, and the fourth fixed cam 413d in substantially the same manner as the first arm 430a. Therefore, a description thereof is omitted to avoid repetition. The description and the drawing are provided where the arm 430 includes the first arm 430a, the second arm 430b, the third arm 430c, and the fourth arm 430d. However, this is an example, and one of ordinary skill in the art may obviously understand that the arm 430 may only include the first arm 430a and the second arm 430b or may only include the third arm 430c and the fourth arm 430d.

According to various example embodiments, the electronic device 300 may include the display 250 including the first area 251, the second area 252, and the folding area 253 between the first area 251 and the second area 252, the first housing 311 configured to support the first area 251, the second housing 312 configured to support the second area 252, and the hinge assembly 400 configured to connect the first housing 311 to the second housing 312, wherein the hinge assembly 400 may include the hinge bracket 410 including the fixed cam 413 on an end of the hinge bracket 410 and configured to define the pair of hinge axes Ha and Hb, the pair of rotators 420a and 420b connected to the hinge bracket 410 and respectively rotatable on the pair of hinge axes Ha and Hb, at least the pair of arms 430 pivotably connected to the pair of rotators 420a and 420b based on the pivot axes Pa, Pb, Pc, and Pd, respectively, and each including the main body 4311 including the rotation cam 433 interoperating with the fixed cam 413 on an end of the main body and the bent body 4312 bent and extending from the main body 4311, and at least the pair of elastic members 440 disposed to be perpendicular to the pair of hinge axes Ha and Hb and configured to provide an elastic force to the bent body 4312 to press the rotation cam 433 with respect to the fixed cam 413.

In various example embodiments, two pairs of arms 430 may be provided, and one pair of arms 430a and 430b may be connected to a first corner of the pair of rotators 420a and 420b and the other pair of arms 430c and 430d may be connected to a second corner of the pair of rotators 420a and 420b.

In various example embodiments, each of the rotators 420a and 420b may include the protruding pin 423 defining the pivot axis Pa, Pb, Pc, or Pd, and each of the arms 430 may further include the pin hole 432 into which the protruding pin 423 is inserted.

In various example embodiments, the protruding pin 423 may protrude from the rear surface of each of the rotators 420a and 420b.

In various example embodiments, each of the arms 430 may further include the protrusion 435 formed on an end of the main body 4311, and each of the rotators 420a and 420b may further include the protrusion insertion groove 425 into which the protrusion 435 is inserted.

In various example embodiments, the protrusion 435 may include the horizontal protrusion 4351 formed in the horizontal direction and the vertical protrusion 4352 formed in the vertical direction, and the protrusion insertion groove 425 may include the horizontal protrusion insertion groove 4251 into which the horizontal protrusion 4351 is inserted and the vertical protrusion insertion groove 4252 into which the vertical protrusion 4352 is inserted.

In various example embodiments, each of the arms 430 may be prevented from escaping from the protruding pin 423 with respect to each of the rotators 420a and 420b by inserting the protrusion 435 into the protrusion insertion groove.

In various example embodiments, the hinge bracket 410 may include the fixed rail 412 with the hinge axis Ha or Hb as the center, and each of the rotators 420a and 420b may include the rotation rail 422 rotatably connected to the fixed rail 412.

In various example embodiments, the hinge bracket 410 may further include the fixed guide rail 414 on an end of the hinge bracket 410, and each of the arms 430 may further include, on an end of the main body 4311, the rotation guide rail 434 rotatably connected to the fixed guide rail 414.

In various example embodiments, the rotation guide rail 434 may be formed at the position adjacent to the rotation cam 433.

In various example embodiments, to protrude, the fixed cam 413 may include the first surface 4131, the second surface 4132, and the third surface 4133, and, to protrude, the rotation cam 433 may include the fourth surface 4331, the fifth surface 4332, and the sixth surface 4333.

In various example embodiments, the hinge assembly 400 may be configured to operate between the folded state in which the first area 251 and the second area 252 face each other and the unfolded state in which the first area 251 and the second area 252 do not face each other, in the unfolded state, the first surface 4131 may contact the third surface 4133, in the folded state, the fourth surface 4331 may contact the sixth surface 4333, and in the intermediate state between the unfolded state and the folded state, the second surface 4132 may contact the fifth surface 4332.

In various example embodiments, in the intermediate state, the arm 430 may pivot on the pivot axis Pa, Pb, Pc, or Pd.

In various example embodiments, when each of the arms 430 pivots, at least one of the second surface 4132 and the fifth surface 4332 may be inclinedly formed such that the second surface 4132 is in surface contact with the fifth surface 4332.

In various example embodiments, each of the rotators 420a and 420b may include the first support protrusion 4241 configured to support one side of the elastic member 440, and each of the arms 430 may further include the second support protrusion 436 configured to support the other side of the elastic member 440 on an end of the bent body 4312.

According to various example embodiments, the hinge assembly 400 applied to the foldable electronic device 300 may include the hinge bracket 410 including the fixed cam 413 on an end of the hinge bracket 410 and configured to define the pair of hinge axes Ha and Hb, the pair of rotators 420a and 420b connected to the hinge bracket 410 and respectively rotatable on the pair of hinge axes Ha and Hb, at least the pair of arms 430 pivotably connected to the pair of rotators 420a and 420b based on the pivot axes Pa, Pb, Pc, and Pd, respectively, and each including the main body 4311 including the rotation cam 433 interoperating with the fixed cam 413 on an end of the main body 4311 and the bent body 4312 bent and extending from the main body 4311, and at least the pair of elastic members 440 disposed to be perpendicular to the pair of hinge axes Ha and Hb and configured to provide an elastic force to the bent body 4312 to press the rotation cam 433 with respect to the fixed cam 413.

In various example embodiments, two pairs of arms 430 may be provided, and one pair of arms 430a and 430b may be connected to one corner of the pair of rotators 420a and 420b and the other pair of arms 430c and 430d may be connected to another corner of the pair of rotators 420a and 420b.

In various example embodiments, each of the arms 430 may further include the protrusion 435 formed on an end of the main body 4311, and each of the rotators 420a and 420b may further include the protrusion insertion groove 425 into which the protrusion 435 is inserted.

In various example embodiments, the hinge bracket 410 may include the fixed rail 412 with the hinge axis Ha or Hb as the center and the fixed guide rail 414 on an end of the hinge bracket 410, the rotator 420a or 420b may include the rotation rail 422 rotatably connected to the fixed rail 412, and the arm 430 may further include, on an end of the main body 4311, the rotation guide rail 434 configured to rotatably connect to the fixed guide rail 414.

According to various example embodiments, the electronic device 300 may include the display 250 including the first area 251, the second area 252, and the folding area 253 between the first area 251 and the second area 252, the first housing 311 configured to support the first area 251, the second housing 312 configured to support the second area 252, and the hinge assembly 400 configured to connect the first housing 311 to the second housing 312 and operate between the folded state in which the first area 251 and the second area 252 face each other and an the unfolded state in which the first area 251 and the second area 252 do not face each other, wherein the hinge assembly 400 may include the hinge bracket 410 including the fixed cam 413 on an end of the hinge bracket 410 and configured to define the pair of hinge axes Ha and Hb, the pair of rotators 420a and 420b connected to the hinge bracket 410 and respectively rotatable on the pair of hinge axes Ha and Hb, at least the pair of arms 430 pivotably connected to the pair of rotators 420a and 420b based on the pivot axes Pa, Pb, Pc, or Pd, respectively, and each including the main body 4311 including the rotation cam 433 interoperating with the fixed cam 413 on an end of the main body and the bent body 4312 bent and extending from the main body 4311, and at least the pair of elastic members 440 disposed to be perpendicular to the pair of hinge axes Ha and Hb and configured to provide an elastic force to the bent body 4312 to press the rotation cam 433 with respect to the fixed cam 413, wherein the rotator 420a or 420b may include the protruding pin 423 protruding from the rear surface of the rotator 420a or 420b and configured to define the pivot axis Pa, Pb, Pc, or Pd, the arm 430 may further include the pin hole 432 into which the protruding pin 423 is inserted, the arm 430 may further include the protrusion 435 formed on an end of the main body 4311, the rotator 420a or 420b may further include the protrusion insertion groove 425 into which the protrusion 435 is inserted, and in the intermediate state between the unfolded state and the folded state, the arm 430 may pivot on the pivot axis Pa, Pb, Pc, or Pd.

What is claimed is:

1. An electronic device comprising:
a display comprising a first area, a second area, and a folding area between the first area and the second area;
a first housing configured to support the first area;
a second housing configured to support the second area; and
a hinge assembly configured to connect the first housing to the second housing,
wherein the hinge assembly comprises:
a hinge bracket comprising a fixed cam on an end of the hinge bracket and configured to define a pair of hinge axes;
a pair of rotators connected to the hinge bracket and respectively rotatable on the pair of hinge axes;
at least a pair of arms pivotably connected to the pair of rotators based on pivot axes, respectively, and each comprising a main body comprising a rotation cam interoperating with the fixed cam on an end of the main body and a bent body bent and extending from the main body; and
at least a pair of elastic members disposed to be perpendicular to the pair of hinge axes and configured to provide an elastic force to the bent body to press the rotation cam with respect to the fixed cam,
wherein the pivot axes extend in a direction perpendicular to the hinge axes and perpendicular to a direction of the elastic force.

2. The electronic device of claim 1, wherein two pairs of arms are provided, and
one pair of arms is connected to a first corner of the pair of rotators and the other pair of arms is connected to a second corner of the pair of rotators.

3. The electronic device of claim 1, wherein each of the rotators comprises a protruding pin defining the pivot axis, and
each of the arms further comprises a pin hole into which the protruding pin is inserted.

4. The electronic device of claim 3, wherein the protruding pin protrudes from a rear surface of each of the rotators.

5. The electronic device of claim 3, wherein each of the arms further comprises a protrusion formed on an end of the main body, and
each of the rotators further comprises a protrusion insertion groove into which the protrusion is inserted.

6. The electronic device of claim 5, wherein the protrusion comprises a horizontal protrusion formed in a horizontal direction and a vertical protrusion formed in a vertical direction, and
the protrusion insertion groove comprises a horizontal protrusion insertion groove into which the horizontal protrusion is inserted and a vertical protrusion insertion groove into which the vertical protrusion is inserted.

7. The electronic device of claim 5, wherein each of the arms is prevented from escaping from the protruding pin with respect to each of the rotators by inserting the protrusion into the protrusion insertion groove.

8. The electronic device of claim 1, wherein the hinge bracket comprises a fixed rail with the hinge axis as a center, and
each of the rotators comprises a rotation rail rotatably connected to the fixed rail.

9. The electronic device of claim 8, wherein the hinge bracket further comprises a fixed guide rail on an end of the hinge bracket, and
each of the arms further comprises, on an end of the main body, a rotation guide rail rotatably connected to the fixed guide rail.

10. The electronic device of claim 9, wherein the rotation guide rail is formed at a position adjacent to the rotation cam.

11. The electronic device of claim 1, wherein, to protrude, the fixed cam comprises a first surface, a second surface, and a third surface, and
to protrude, the rotation cam comprises a fourth surface, a fifth surface, and a sixth surface.

12. The electronic device of claim 11, wherein the hinge assembly is configured to operate between a folded state in which the first area and the second area face each other and an unfolded state in which the first area and the second area do not face each other,
- in the unfolded state, the first surface contacts the third surface,
- in the folded state, the fourth surface contacts the sixth surface, and
- in an intermediate state between the unfolded state and the folded state, the second surface contacts the fifth surface.

13. The electronic device of claim 12, wherein, in the intermediate state, the arm pivots on the pivot axis.

14. The electronic device of claim 13, wherein, when each of the arms pivots, at least one of the second surface and the fifth surface is inclinedly formed such that the second surface is in surface contact with the fifth surface.

15. The electronic device of claim 1, wherein each of the rotators comprises a first support protrusion configured to support one side of the elastic member, and
- each of the arms further comprises a second support protrusion configured to support the other side of the elastic member on an end of the bent body.

16. A hinge assembly applied to a foldable electronic device, the hinge assembly comprising:
- a hinge bracket comprising a fixed cam on an end of the hinge bracket and configured to define a pair of hinge axes;
- a pair of rotators connected to the hinge bracket and respectively rotatable on the pair of hinge axes;
- at least a pair of arms pivotably connected to the pair of rotators based on pivot axes, respectively, and each comprising a main body comprising a rotation cam interoperating with the fixed cam on an end of the main body and a bent body bent and extending from the main body; and
- at least a pair of elastic members disposed to be perpendicular to the pair of hinge axes and configured to provide an elastic force to the bent body to press the rotation cam with respect to the fixed cam,
- wherein the pivot axes extend in a direction perpendicular to the hinge axes and perpendicular to a direction of the elastic force.

17. The hinge assembly of claim 16, wherein two pairs of arms are provided, and
- one pair of arms is connected to one corner of the pair of rotators and the other pair of arms is connected to another corner of the pair of rotators.

18. The hinge assembly of claim 16, wherein each of the arms further comprises a protrusion formed on an end of the main body, and
each of the rotators further comprises a protrusion insertion groove into which the protrusion is inserted.

19. The hinge assembly of claim 16, wherein the hinge bracket comprises a fixed rail with the hinge axis as a center and a fixed guide rail on an end of the hinge bracket,
- the rotator comprises a rotation rail rotatably connected to the fixed rail, and
- the arm further comprises, on an end of the main body, a rotation guide rail configured to rotatably connect to the fixed guide rail.

20. An electronic device comprising:
- a display comprising a first area, a second area, and a folding area between the first area and the second area;
- a first housing configured to support the first area;
- a second housing configured to support the second area; and
- a hinge assembly configured to connect the first housing to the second housing and operate between a folded state in which the first area and the second area face each other and an unfolded state in which the first area and the second area do not face each other, wherein the hinge assembly comprises:
- a hinge bracket comprising a fixed cam on an end of the hinge bracket and configured to define a pair of hinge axes;
- a pair of rotators connected to the hinge bracket and respectively rotatable on the pair of hinge axes;
- at least a pair of arms pivotably connected to the pair of rotators based on pivot axes, respectively, and each comprising a main body comprising a rotation cam interoperating with the fixed cam on an end of the main body and a bent body bent and extending from the main body; and
- at least a pair of elastic members disposed to be perpendicular to the pair of hinge axes and configured to provide an elastic force to the bent body to press the rotation cam with respect to the fixed cam, wherein the rotator comprises a protruding pin protruding from a rear surface of the rotator and configured to define the pivot axis,
the arm further comprises a pin hole into which the protruding pin is inserted,
the arm further comprises a protrusion formed on an end of the main body,
the rotator further comprises a protrusion insertion groove into which the protrusion is inserted, and
in an intermediate state between the unfolded state and the folded state, the arm pivots on the pivot axis.

* * * * *